(12) United States Patent
Allen et al.

(10) Patent No.: US 7,302,651 B2
(45) Date of Patent: Nov. 27, 2007

(54) TECHNOLOGY MIGRATION FOR INTEGRATED CIRCUITS WITH RADICAL DESIGN RESTRICTIONS

(75) Inventors: Robert J. Allen, Jericho, VT (US); Cam V. Endicott, Essex Junction, VT (US); Fook-Luen Heng, Yorktown Heights, NY (US); Jason D. Hibbeler, Williston, VT (US); Kevin W. McCullen, Essex Junction, VT (US); Rani Narayan, San Jose, CA (US); Robert F. Walker, St. George, VT (US); Xin Yuan, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 404 days.

(21) Appl. No.: 10/904,225

(22) Filed: Oct. 29, 2004

(65) Prior Publication Data

US 2006/0101356 A1 May 11, 2006

(51) Int. Cl.
*G06F 17/50* (2006.01)
*G03F 1/00* (2006.01)
*G03C 5/00* (2006.01)
*G01R 31/26* (2006.01)

(52) U.S. Cl. .................. 716/3; 716/1; 716/4; 716/5; 716/10; 716/19; 716/21; 430/5; 430/394; 438/14

(58) Field of Classification Search .................. 716/1, 716/3–6, 8–10, 13, 14, 21; 430/5, 394; 438/14
See application file for complete search history.

(56) References Cited

U.S. PATENT DOCUMENTS

| | | | |
|---|---|---|---|
| 5,535,134 A | | 7/1996 | Cohn et al. |
| 6,099,582 A | * | 8/2000 | Haruki ........................ 716/11 |
| 6,209,123 B1 | * | 3/2001 | Maziasz et al. ............... 716/14 |
| 6,378,113 B1 | * | 4/2002 | Levitsky et al. ............... 716/6 |
| 6,567,967 B2 | * | 5/2003 | Greidinger et al. ........... 716/10 |
| 6,756,242 B1 | * | 6/2004 | Regan .......................... 438/14 |
| 6,818,389 B2 | * | 11/2004 | Fritze et al. ................. 430/394 |
| 6,901,577 B2 | * | 5/2005 | Kotani et al. .................. 716/21 |
| 6,925,627 B1 | * | 8/2005 | Longway et al. ............. 716/13 |
| 6,973,636 B2 | * | 12/2005 | Shin et al. ..................... 716/19 |
| 7,007,258 B2 | * | 2/2006 | Li ................................. 716/9 |

(Continued)

OTHER PUBLICATIONS

Chen et al., "Hierarchical dummy fill for process uniformity"; Jan. 30-Feb. 2, 2001; Design Automation Conference, Proceedings of the ASP-DAC 2001. Asia and South Pacific; pp. 139-144.*

(Continued)

*Primary Examiner*—Jack Chiang
*Assistant Examiner*—Helen Rossoshek
(74) *Attorney, Agent, or Firm*—Richard M. Kotulak; Hoffman, Warnick & D'Alessandro LLC

(57) ABSTRACT

A method, system and program product for migrating an integrated circuit (IC) design from a source technology without radical design restrictions (RDR) to a target technology with RDR, are disclosed. The invention implements a minimum layout perturbation approach that addresses the RDR requirements. The invention also solves the problem of inserting dummy shapes where required, and extending the lengths of the critical shapes and/or the dummy shapes to meet 'edge coverage' requirements.

39 Claims, 16 Drawing Sheets

U.S. PATENT DOCUMENTS

| | | | | |
|---|---|---|---|---|
| 7,039,881 B2 * | 5/2006 | Regan | ............................ | 716/3 |
| 7,096,446 B2 * | 8/2006 | Karniewicz | ..................... | 716/9 |
| 7,137,092 B2 * | 11/2006 | Maeda | .......................... | 716/8 |
| 7,155,689 B2 * | 12/2006 | Pierrat et al. | ................... | 716/4 |
| 2004/0185351 A1 * | 9/2004 | Cote et al. | ...................... | 430/5 |
| 2005/0251771 A1 * | 11/2005 | Robles | ........................... | 716/5 |
| 2006/0085773 A1 * | 4/2006 | Zhang | ........................... | 716/4 |
| 2006/0121715 A1 * | 6/2006 | Chang et al. | ............... | 438/599 |
| 2006/0195809 A1 * | 8/2006 | Cohn et al. | .................... | 716/10 |

OTHER PUBLICATIONS

Carlson, E.C. et al., "A Scanline Data Structure Processor for VLSI Geometry Checking," Computer-Aided Design of Integrated Circuits and Systems, IEEE Transactions, vol. 6, Issue 5, Sep. 1987, pp. 780-794.

* cited by examiner

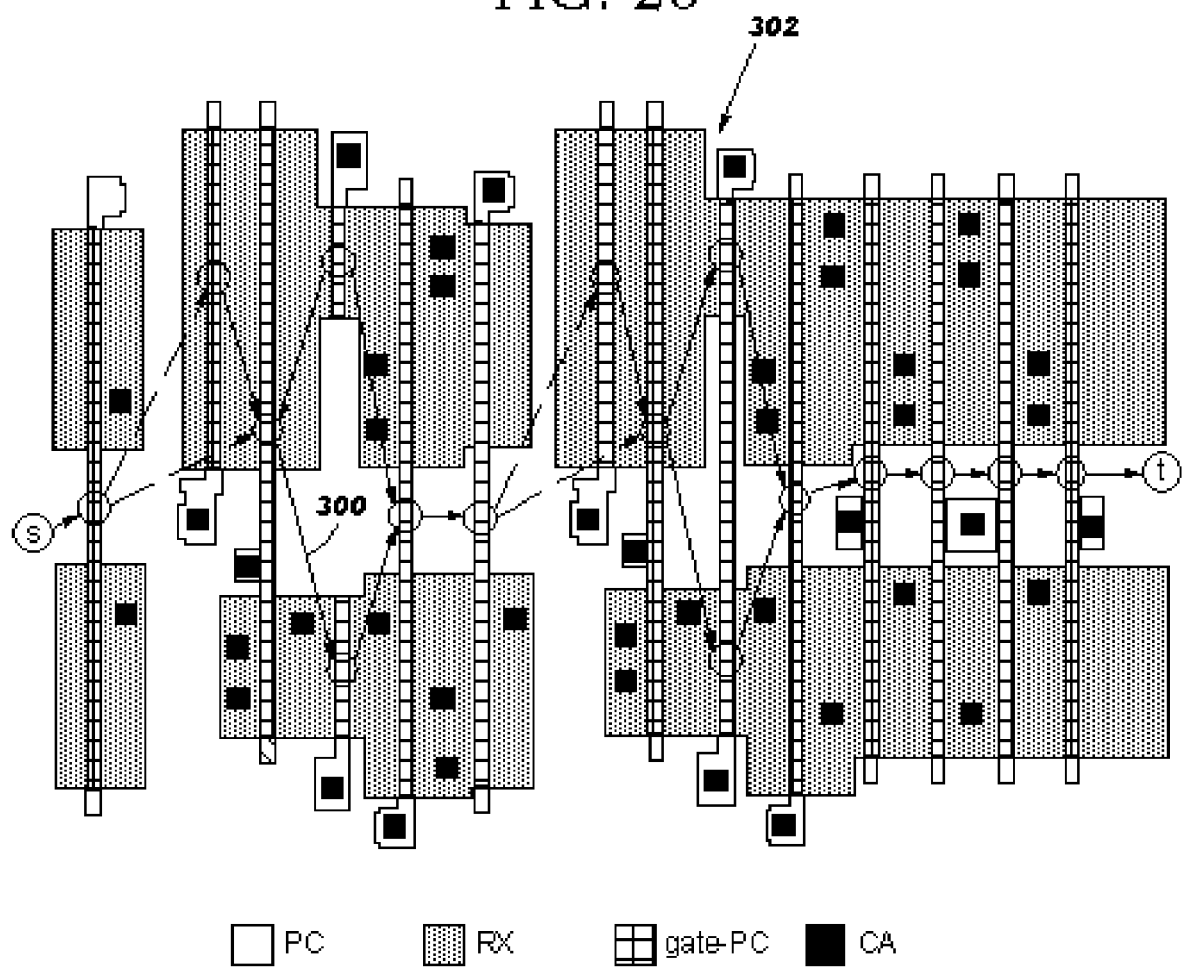

TECHNOLOGY MIGRATION FOR INTEGRATED CIRCUITS WITH RADICAL DESIGN RESTRICTIONS

BACKGROUND OF THE INVENTION

1. Technical Field

The present invention relates generally to technology migration for integrated circuits (ICs), and more particularly, to a method, system and program product for technology migration for an IC with radical design restrictions.

2. Related Art

Design migration is an essential process to achieve maximum layout productivity in very large-scale integrated (VLSI) circuit designs. Conventional graph-based compaction techniques were developed to translate a symbolic layout to a physical layout based on simplistic edge-based ground rules. These techniques have also been used to solve the design migration problem. More recently, a minimum layout perturbation formulation of the design migration problem results in a method that preserves the integrity of the source layout. While existing design migration software continues to be fine tuned, its functionality has become relatively mature. However, as technology is progressing into the sub-wavelength regime, new layout challenges have emerged in the form of groupings of fundamental design restrictions, which is sometimes referred to in the art as "radical design restrictions" (hereinafter "RDR"). RDR is proposed to better enable alternating phase shifted mask designs and control line-width on the polysilicon-conductor level in ultra-deep submicron technologies. RDR requires, for example, a limited number of narrow line widths, a single orientation of narrow features, narrow features placed on a uniform and coarse pitch, a uniform proximity environment for all critical gates and a limited number of pitches for critical gates. This regular design style presents a new challenge to the design migration solution, and demands new functionalities in the existing design migration software.

In view of the foregoing, there is a need in the art to address the problems of the related art.

SUMMARY OF THE INVENTION

The invention includes a method, system and program product for migrating an integrated circuit design from a source technology without RDR to a target technology with RDR. The invention implements a minimum layout perturbation approach that addresses RDR. The invention also solves the problem of inserting one or more dummy shapes where required, and extending the lengths of the critical shapes and/or the dummy shapes to meet "edge coverage" requirements.

A first aspect of the invention is directed to a method for migrating an integrated circuit (IC) design layout from a source technology without radical design restrictions (RDR) to a target technology with RDR, the method comprising the steps of: legalizing the design layout to meet an RDR grid constraint and fix any ground rule violation in a first direction; inserting required dummy shapes; and running a minimum perturbation analysis in order to address an edge coverage requirement of at least one critical shape and fix any ground rule violation in a second direction.

A second aspect of the invention is directed to a system for migrating an integrated circuit (IC) design layout from a source technology without radical design restrictions (RDR) to a target technology with RDR, the system comprising: means for legalizing the layout to meet an RDR grid constraint and fix any ground rule violation in a first direction; means for inserting required dummy shapes; and means for running a minimum perturbation analysis in order to address an edge coverage requirement of at least one critical shape and fix any ground rule violation in a second direction.

A third aspect of the invention is directed to a computer program product comprising a computer useable medium having computer readable program code embodied therein for migrating an integrated circuit (IC) design from a source technology without radical design restrictions (RDR) to a target technology with RDR, the program product comprising: program code configured to legalize the layout to meet an RDR grid constraint and fix any ground rule violation in a first direction; program code configured to insert required dummy shapes; and program code configured to run a minimum perturbation analysis in order to address an edge coverage requirement of at least one critical shape and fix any ground rule violation in a second direction.

A fourth aspect of the invention is directed to a method for legalizing an integrated circuit design layout subject to ground rules and radical design restrictions (RDR) grid constraints with minimum layout perturbation of an original design, the method comprising the steps of: computing a target on-pitch position for each of a plurality of critical shapes with minimum layout perturbation while satisfying the RDR grid constraint; and legalizing the design layout as a linear programming problem by treating the target on-pitch positions of the critical shapes as a set of ground rule space constraints between the plurality of critical shapes and a design layout boundary.

A fifth aspect of the invention is directed to a system for legalizing an integrated circuit design layout subject to ground rules and radical design restrictions (RDR) grid constraints with minimum layout perturbation of an original design, the system comprising: means for computing a target on-pitch position for each of a plurality of critical shapes with minimum layout perturbation while satisfying the RDR grid constraint; and means for legalizing the design layout as a linear programming problem by treating the target on-pitch positions of the critical shapes as a set of ground rule space constraints between the plurality of critical shapes and a design layout boundary.

A sixth aspect of the invention is directed to a computer program product comprising a computer useable medium having computer readable program code embodied therein for legalizing an integrated circuit design layout subject to ground rules and radical design restrictions (RDR) grid constraints with minimum layout perturbation of an original design, the program product comprising: program code configured to compute a target on-pitch position for each of a plurality of critical shapes with minimum layout perturbation while satisfying the RDR grid constraint; and program code configured to legalize the design layout as a linear programming problem by treating the target on-pitch positions of the critical shapes as a set of ground rule space constraints between the plurality of critical shapes and a design layout boundary.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein:

FIG. 20 shows an illustrative edge-weighted graph.

DETAILED DESCRIPTION OF THE INVENTION

The invention includes a system, method and program product for migrating an integrated circuit (IC) design from a source technology without RDR to a target technology with RDR. Although RDRs are currently only required for critical gates, the invention is applicable to legalize shapes with similar constraints, such as metal wiring shapes. Therefore, the term "critical shapes" will be used herein to refer to gates, PC shapes or metal wiring shapes, which are required to meet the grid constraints. Critical shapes are to be differentiated from "dummy shapes," which the invention may insert to make an IC design legal, and meet a design rule requirement.

Figure 1:
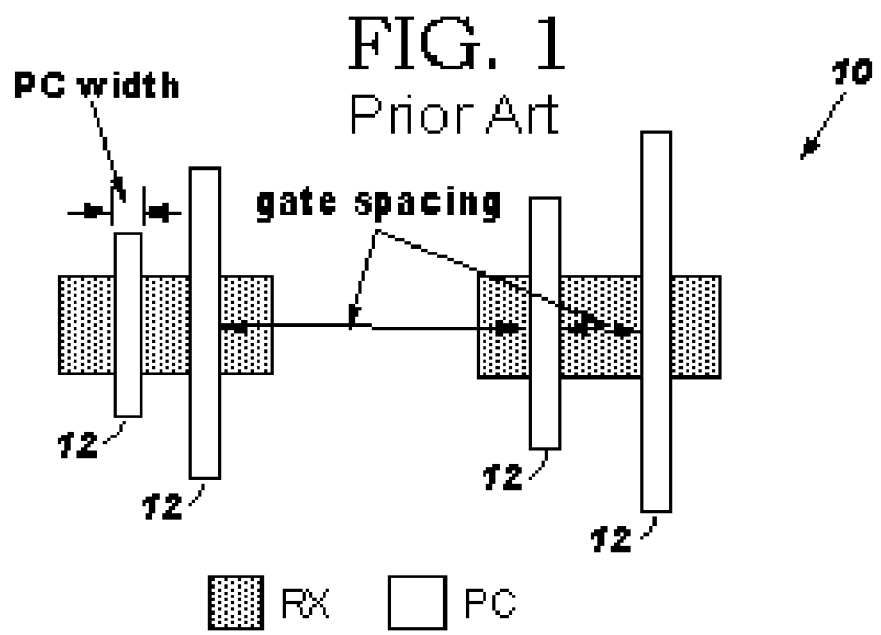
FIG. 1 shows an illustrative initial layout of critical gates before legalization.
Figure 2:
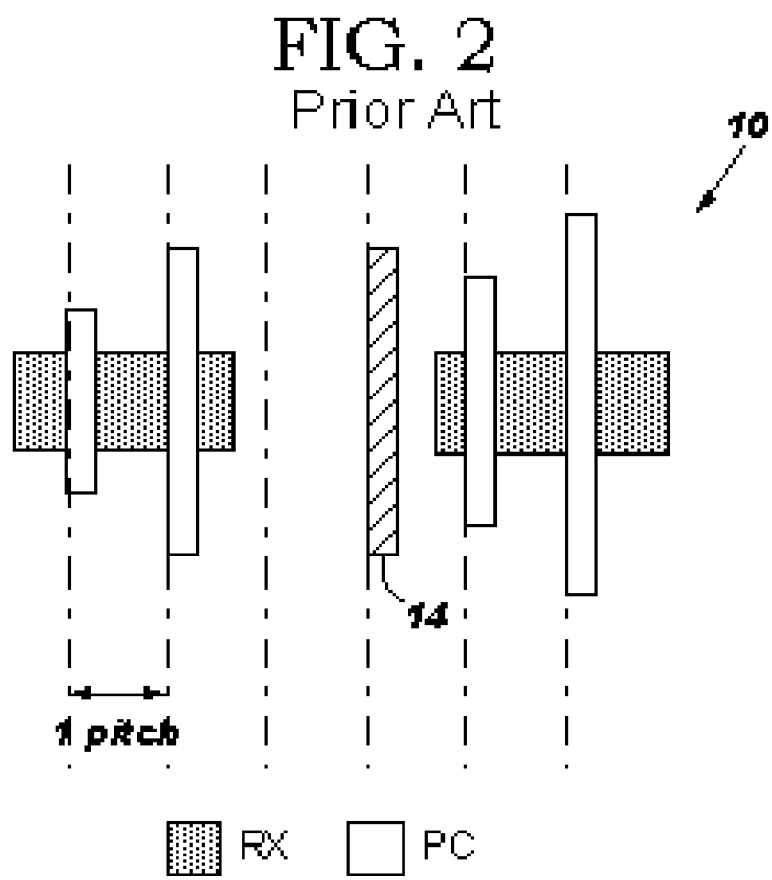
FIG. 2 shows the layout of FIG. 1 after legalization where a dummy shape has been inserted in order to meet RDR.

In evaluating RDR, a gate is formed by the intersection between a polysilicon-conductor (PC) shape and a diffusion region (RX). "Pitch" is defined as the spacing between the centerlines of two adjacent gates. "Critical gates" are those that must comply with RDR in order to be properly printed in the manufacturing process. Usually, the critical gates have the minimal PC width over the diffusion region. An example situation of the space restriction of the critical gates in the legalization process is shown below in FIGS. 1-2. (Space restrictions are also referred to as "grid constraints" as they require placement of critical gates on a coarse grid.) FIG. 1 shows an initial layout 10 of critical gates 12 before legalization. As shown in FIG. 2, given a set of fixed pitches, e.g., 250 nm or 500 nm, for critical gates with a PC width of 60 nm over the diffusion region, after legalization all the critical gates must be placed on a 250 nm grid with spacing between adjacent critical gates of either 190 nm or 440 nm. FIG. 2 shows layout 10 after legalization where a dummy PC shape 14 has been inserted in order to provide the uniform proximity environment required by RDR. To illustrate the underlying grid constraints, in FIG. 2, grid lines are drawn to match the left edge of each critical gate. When the critical gates have the uniform PC width over RX, it does not matter whether the grid lines match the centerline or the edge line of the critical gates as long as the spacing constraints are met. For purposes of description, the critical gates are assumed to have the minimal PC width over RX and thus the pitch is the sum of minimal gate spacing and minimal PC width over RX.

Figure 3A:
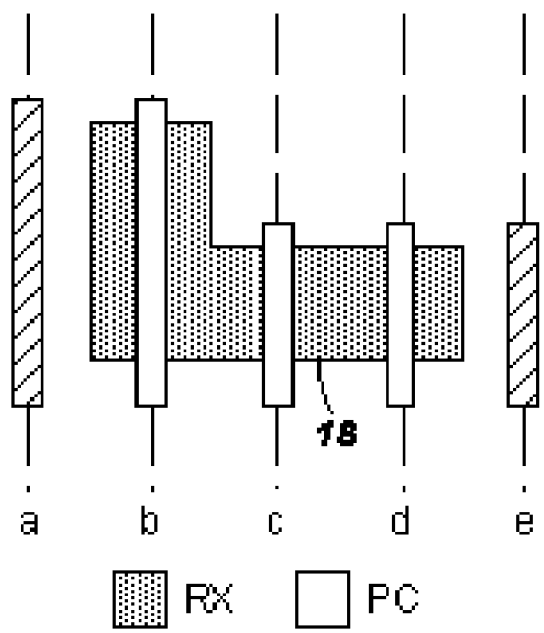
FIGS. 3A-B show an example layout including critical shapes and dummy shapes, and a gate extension.
Figure 3B:
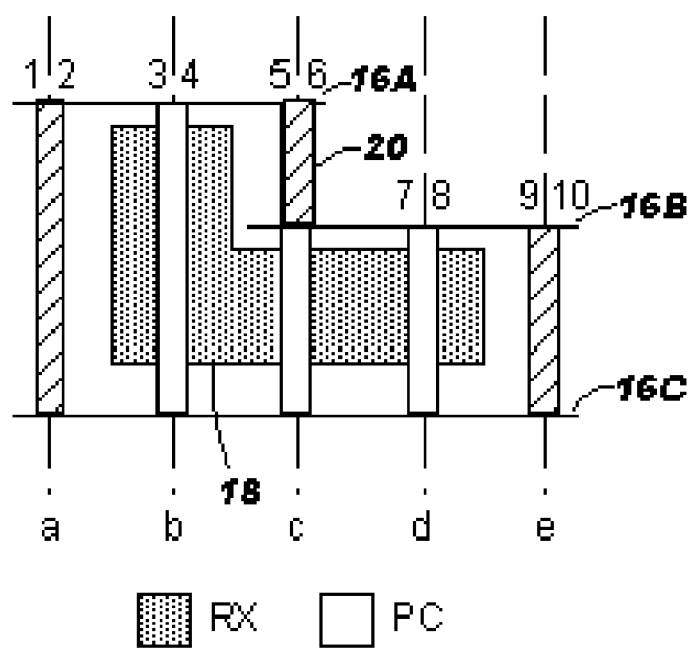

FIGS. 3A-B show an example situation of an "edge coverage" requirement, i.e., a PC shape end extension is required by RDR. These figures include critical gates b, c and d, dummy PC shapes a and e, and a diffusion region 18. In FIGS. 3A-B, the grid lines match the centerline of the PC shapes. Dummy PC shapes a and e are required to be inserted into the design so that each critical gate b, c, d is surrounded to its left and right by a PC shape in order to provide a uniform proximity environment. In addition, referring to FIG. 3B, the horizontal lines 16A, 16B, 16C indicate the heights to which the surrounding PC shapes must extend in order for adjacent PC shapes to be printed correctly. In this example, edge 3 on critical gate b requires edge 2 on dummy shape a to have the same length in order to be printed properly. Similarly, edge 4 on critical gate b requires edge 5 on critical gate c to be as long as edge 4 so that edge 4 can be printed properly. In this case, critical gate b requires shorter critical gate c to extend upward beyond horizontal line 16B to horizontal line 16A. A "gate extension" 20 therefore is required on critical gate c to meet RDR, as shown in FIG. 3B. A "gate extension" as used herein is any extension of a gate required for proper printing of an adjacent gate. Edge 7 on critical gate d, however, only requires the portion of edge 6 on critical gate c, which is as long as edge 7. In this example, the ground rule manual requires all critical gate edges (critical gate edges over diffusion regions plus an extension value beyond the diffusion region) to have another PC shape edge one or two pitches away for the entire length of the critical section (the actual gate plus an extension at each end). This rule requires both extensions and addition of dummy shapes. Details of edge/gate relationships for FIG. 3B are as follows:

| Gate/Dummy Shape | Requires (in order to print correctly) |
|---|---|
| a | Nothing, it's a dummy shape; it is not required to be printed correctly. |
| b | a and c, specifically edges 1/2 and 5/6 required to print edges 3 and 4. |
| c | b and d, specifically edges 3/4 and 7/8. Edges 3/4 need only extend for the length of gate c. |
| d | c and e, specifically edges 5/6 and 9/10 are required to print edges 7 and 8 |
| e | Nothing, it's a dummy shape; it is not required to be printed correctly. |

The above two examples illustrate the new demands for a technology migration process when a design is migrated from a source technology without RDR to a target technology with RDR.

Layout compaction is one technique used for migrating designs to different technologies, which is based on the longest path algorithm technique. The compaction technique has been applied to grid constraints, as described above, as discussed in "VLSI layout compaction with grid and mixed constraints" by Lee and Tang in IEEE Transaction of Computer-Aided Design 1987. In operation, the layout compaction technique compacts the layout as much as possible while satisfying the grid constraints. Minimum layout perturbation is another technique that uses a new criterion for layout modification in the migration process to fix the design rules violations with minimum total perturbation of the layout. Compared with the layout compaction technique, a minimum layout perturbation-based legalization technique fixes the rule violations and preserves the given layout as much as possible. The minimum layout perturbation technique is also advantageous because it addresses cases with conflicting rules that cause positive cycles and cannot be handled by the conventional longest path-based compaction techniques. The minimum layout perturbation technique was first introduced in "A VLSI artwork legalization technique based on a new criterion of minimum layout perturbation" by Heng et al. in International Symposium on Physical Design 1997 and is disclosed in U.S. Pat. No. 6,189,132, which is hereby incorporated by reference. Unfortunately, the original minimum layout perturbation technique does not consider the grid constraints, which is required by RDR.

Figure 4:
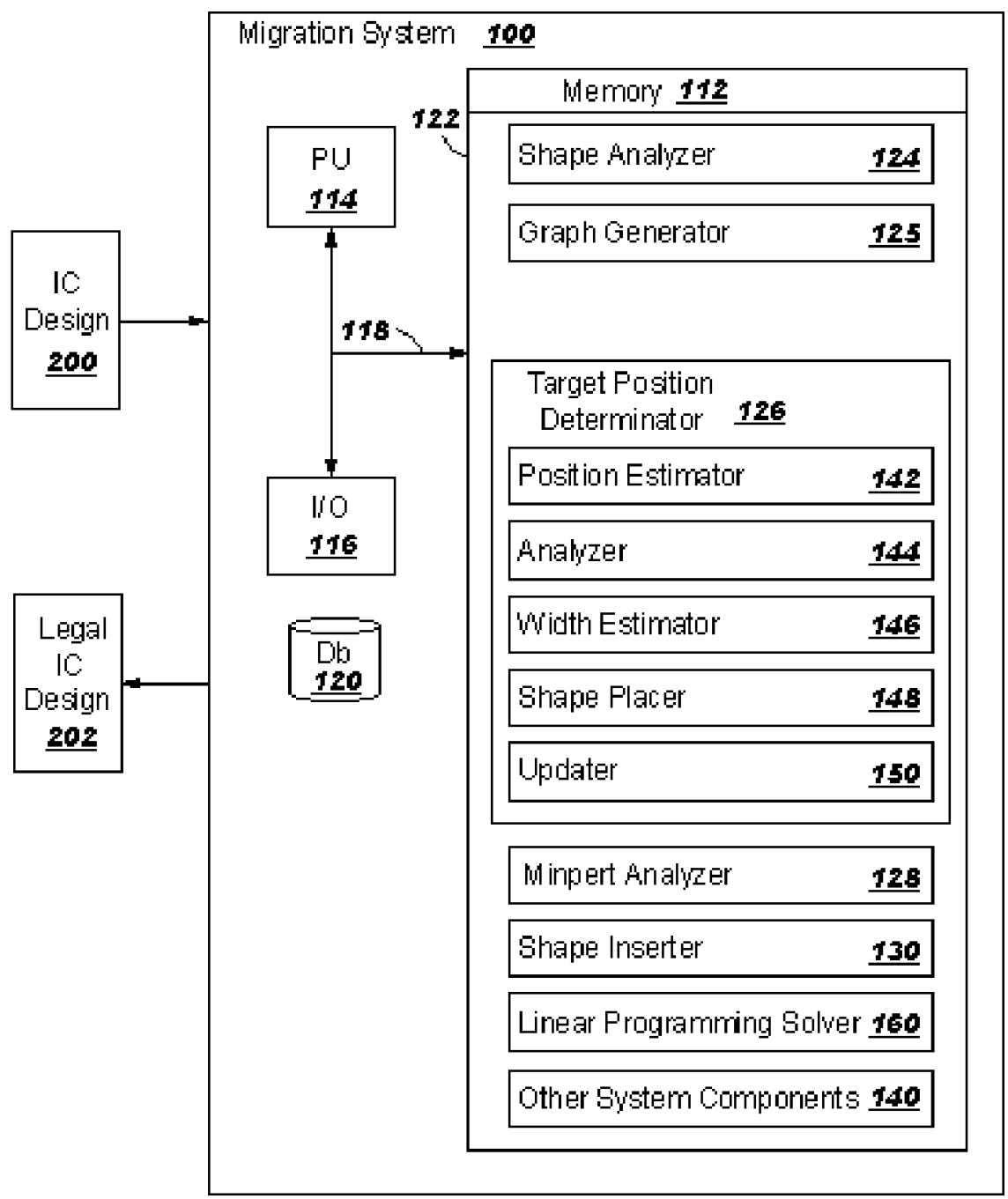
FIG. 4 shows a migration system in accordance with one embodiment of the invention.

For purposes of clarity only, the following description includes the sub-headings:

I. System Overview
II. Operation Methodology
A. Details of Legalizing to Meet Grid Constraints on Critical Shapes and Fix Ground Rule Violations in Direction 1—step S6
  1. The MPRDR Problem
  a) Background for Solving MPRDR Problem
  b) Formulating Mixed Integer Linear Programming (MILP) Problem Relative to Solving the MPRDR Problem
  2. Overview of Heuristic Two-Stage Approach to Solve MPRDR Problem
  a) Stage 1: Compute Target On-Pitch Positions
  b) Stage 2: Legalize the layout with minimum layout perturbation
III. Conclusion
I. System Overview With reference to the accompanying drawings, FIG. 4 is a block diagram of an integrated circuit (IC) design migration system 100 capable of migrating an integrated circuit (IC) design from a source technology without RDR to a target technology with RDR in accordance with the invention. System 100 includes a memory 112, a processing unit (PU) 114, input/output devices (I/O) 116 and a bus 118. A database 120 may also be provided for storage of data relative to processing tasks. Memory 112 includes a program product 122 that, when executed by PU 114, comprises various functional capabilities described in further detail below. Memory 112 (and database 120) may comprise any known type of data storage system and/or transmission media, including magnetic media, optical media, random access memory (RAM), read only memory (ROM), a data object, etc. Moreover, memory 112 (and database 120) may reside at a single physical location comprising one or more types of data storage, or be distributed across a plurality of physical systems. PU 114 may likewise comprise a single processing unit, or a plurality of processing units distributed across one or more locations. I/O 116 may comprise any known type of input/output device including a network system, modem, keyboard, mouse, scanner, voice recognition system, CRT, printer, disc drives, etc. Additional components, such as cache memory, communication systems, system software, etc., may also be incorporated into system 100. System 100 receives an IC design 200 to be legalized and outputs a legalized IC design 202. It should be recognized that system 100 may be incorporated as a part of a larger IC design system or be provided as a separate system.

As shown in FIG. 4, program product 122 may include a shape analyzer 124, a graph generator 125, a target position determinator 126, a minimum perturbation (hereinafter "minpert") analyzer 128, a shape inserter 130, a linear programming solver 160, and other system components 140. Target position determinator 126 may include a position estimator 142, an analyzer 144, a width estimator 146, a shape placer 148 and an updater 150. Other system components 140 may include any other necessary functionality not expressly described herein.

It should be recognized that while system 100 has been illustrated as a standalone system, it may be included as part of a larger IC design system or a peripheral thereto.

II. Operational Methodology

Turning to the flow diagram of FIG. 5 in conjunction with FIGS. 4 and 6-16, operation of system 100 will now be described in greater detail. As shown in FIG. 6, in an initial state, a design layout 210 includes critical shapes 212 of uniform orientation. A diffusion region 214 is shown below critical shapes 212.

The methodology starts with a design layout 210 (FIG. 6) in a source technology without RDR. After scaling layout 210 (FIG. 6) to the target technology such that the critical gates have the correct PC width over the diffusion region required by the target technology, a preliminary determination is made by a shape analyzer 124 (FIG. 4) as to whether there are critical shapes of uniform orientation in the design layout. It should be recognized that the determination at step S1 may be simply known from the design layout. Alternatively, if necessary, some analysis to determine whether critical shapes 212 are present can be made, e.g., a determination as to whether PC shapes are placed over diffusion region 214 in the layout. If the design does not have critical shapes 212, i.e., NO at step S1, then there is no special handling in the migration process. In this case, at step S2, a conventional minimum layout perturbation-based (hereinafter "minpert") legalization process is conducted by a minpert analyzer 128 to fix any ground rule violations.

When there are critical shapes 212, i.e., YES at step S1, how system 100 addresses the situation depends on the orientation of the critical shapes. In this case, at step S3, shape analyzer 124 determines the orientation of critical shapes 212. For vertical critical shapes (as shown in FIG. 6), at step S4, "Direction 1" is assigned as an X-direction (horizontal) and "Direction 2" is assigned as a Y-direction (vertical). In contrast, for horizontal critical shapes, at step S5, Direction 1 is assigned as a Y-direction (vertical) and Direction 2 is assigned as an X-direction (horizontal). In any event, system 100 proceeds through the next five steps to legalize the layout for RDR and other ground rule constraints. For purposes of description, the critical shape orientation is assumed to extend in a Y-direction (vertical on page), as shown in FIG. 6. That is, a longitudinal axis of the plurality of critical shapes extends in a Y-direction.

In step S6, the layout is legalized to meet an RDR grid constraint and fix any ground rule violation in Direction 1 by graph generator 125, target position determinator 126, and linear programming solver 160. The inputs are scaled layout 210 (FIG. 6) where critical shapes are of uniform orientation, and the coarse (grid) pitch P required by RDR. The RDR grid constraints on critical shapes in this legalization step may be, for example, when critical shapes are the gates, as follows: a) all the critical shapes shall be placed on the coarse grid of pitch P; b) the space between the left edges of two adjacent critical shapes on a common diffusion shall be either P or 2P; c) the space between the left edges of two adjacent critical shapes not on a common diffusion shall be kP, where k is a positive integer number such that dummy shapes can be inserted to mimic the minimum pitch. The objective of this step is to legalize a layout subject to the ground rules and the above three RDR grid constraints with minimum layout perturbation of the original design. Hereinafter, this problem shall be referred to as minimum perturbation legalization with RDR grid constraints (MPRDR). Details of the processing to solve this problem relative to graph generator 125 and target position determinator 126 will be described in a separate section below.

Figure 8:
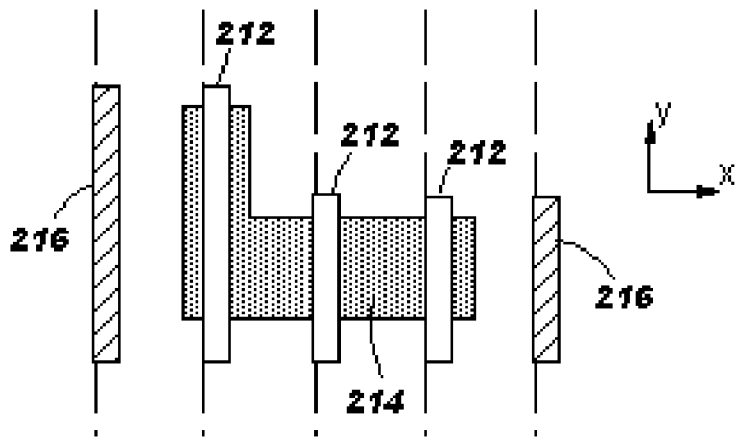
FIG. 8 shows the IC design layout of FIG. 7 after dummy shape insertion.

Steps S7-S9, collectively, represent a step of inserting required dummy shapes 216 (FIG. 8). It should be recognized that if no dummy shapes 216 (FIG. 8) are necessary, steps S7, S8, and S9 may be omitted. It should also be recognized that the steps S7, S8, and S9 may be replaced by any method of inserting required dummy shapes that does not introduce new ground rule violations. For example, only an insertion step, similar to step S8, alone could be conducted.

Figure 7:
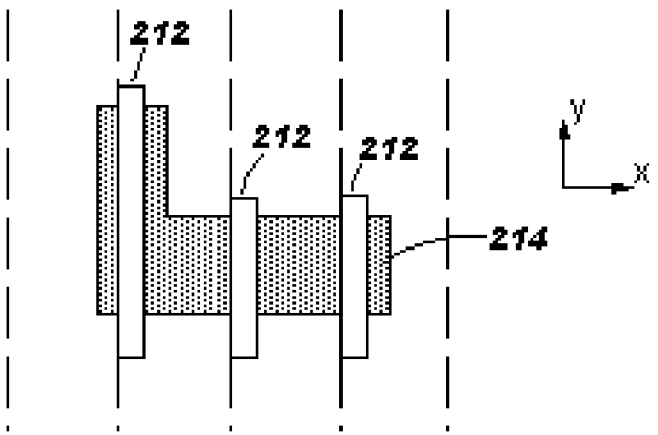
FIG. 7 shows the IC design layout of FIG. 6 after diffusion region re-sizing.

In a seventh step S7, the layout is legalized in Direction 1 to prepare for dummy shape insertion. The input is the legalized layout in Direction 1 with the critical shapes placed on the pitch from step S6. As shown in FIG. 7, in order to facilitate dummy shape insertion at a diffusion region 214 break between any two adjacent critical shapes 212, diffusion region 214 which overlaps past critical shapes is minimized to the minimal value defined by a ground rule. In this step, a minpert analysis is run by minpert analyzer 128 in Direction 1 with the grid positions for critical shapes 212 frozen, but the other shapes allowed to move. In particular, minpert analysis is run by minpert analyzer 128 in Direction 1 to pull diffusion region 214 as close to critical shapes 212 as possible by changing the ground rule for diffusion region 214 overlap past critical shapes 212 to be exactly equal to the minimum value an original design rule allows. In this fashion, diffusion regions are reduced around the critical shapes.

Next, at step S8, as shown in FIG. 8, at least one dummy shape 216 may be inserted by shape inserter 130 to satisfy a minimum spacing requirement. In one embodiment, a dummy shape 216 is placed on pitch in any area that is within no more than two grid positions of a critical shape 212, and is not covered by diffusion region 214 or another shape.

Figure 9:
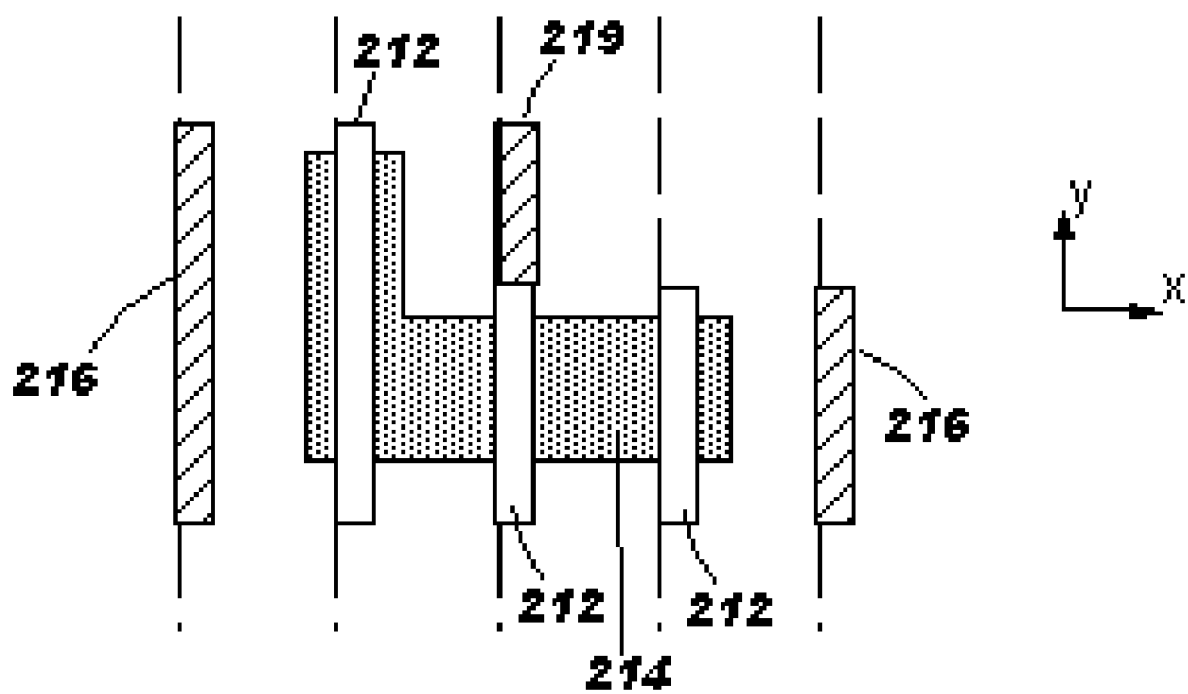
FIG. 9 shows the IC design layout of FIG. 8 after shape extension.

At step S9, the layout is legalized in Direction 1 to clear up rule violations due to dummy shape 216 insertion. The input is the layout, as shown in FIG. 8, with dummy shapes inserted. Due to the newly inserted dummy shapes 216, some ground rule violations may be introduced and thus a minpert legalization is run by minpert analyzer 128 in Direction 1 to clean up those ground rule violations. All critical shapes 212 and dummy shapes 216 are not moved during the legalization in this step. Only contacts, diffusion region 214 and PC wiring shapes are moved to fix the ground rule violations Next, at step S10, the layout is legalized to meet an "edge coverage" requirement of at least one critical shape and dummy shape and fix any ground rule violations in Direction 2. An "edge coverage" requirement is one for which a shape extension is necessary to ensure proper printing of an adjacent critical shape. In the gate orientation illustrated, Direction 2 is parallel to the longitudinal axis of the plurality of active regions, i.e., in a Y-direction. In this case, input is a legalized layout with dummy shapes inserted and ground rule correct in Direction 1. A minpert legalization is run by minpert analyzer 128 in Direction 2 to: a) clean up ground rule violations in Direction 2; b) extend critical shapes 212 (FIG. 9) and dummy shapes 216, as necessary, to include shape extension 219 to satisfy an "edge coverage" constraint from RDR, as shown in FIG. 9; c) make all horizontal PC wiring non-critical, in order to minimize (or eliminate) issues of phase shift mask layout. If a horizontal PC shape is non-critical, then only the critical shapes and dummy shapes require phase shifting. The phase and block mask shapes will be confined to the circuit rows, and will be forced to lay out in parallel stripes (as a result of the RDR grid constraint).

Shape Extension Issues Relative to Step S10: With further regard to step S10, following is the detailed description regarding how to construct constraints for critical shape and dummy shape extension constraints from RDR. Turning to FIGS. 10-16, a description of how shape extensions in a minimum perturbation framework are applied by minpert analyzer 128 will now be described. In general terms, in order to extend critical or dummy shapes, constraints are generated between adjacent shapes. For each dummy shape and critical shape, a marker shape is generated. "Marker shapes" as used herein mean auxiliary shapes which are added to the design, and used when system 100 is required to apply a constraint or rule to some, but not all, of the shapes on a particular level. In those situations, the marker shapes are placed over the shapes that will be modified. In this case, rules are applied to some of the PC shapes and some of the gates, but not to all of them. In addition, each marker shape is a certain distance wider (e.g., one unit) than either side of the gates that it covers, and the ends of the marker shape are aligned exactly with the gate ends. The marker shape is represented on a different "level" in the design. Each marker shape level then is assigned a different set of ground rules and constraints with the PC shapes and gates. In this fashion, if a marker shape grows (or extends), it will push the minimum width section of the shapes it covers in front of it as it grows. This is referred to as "plowing."

Figure 10:
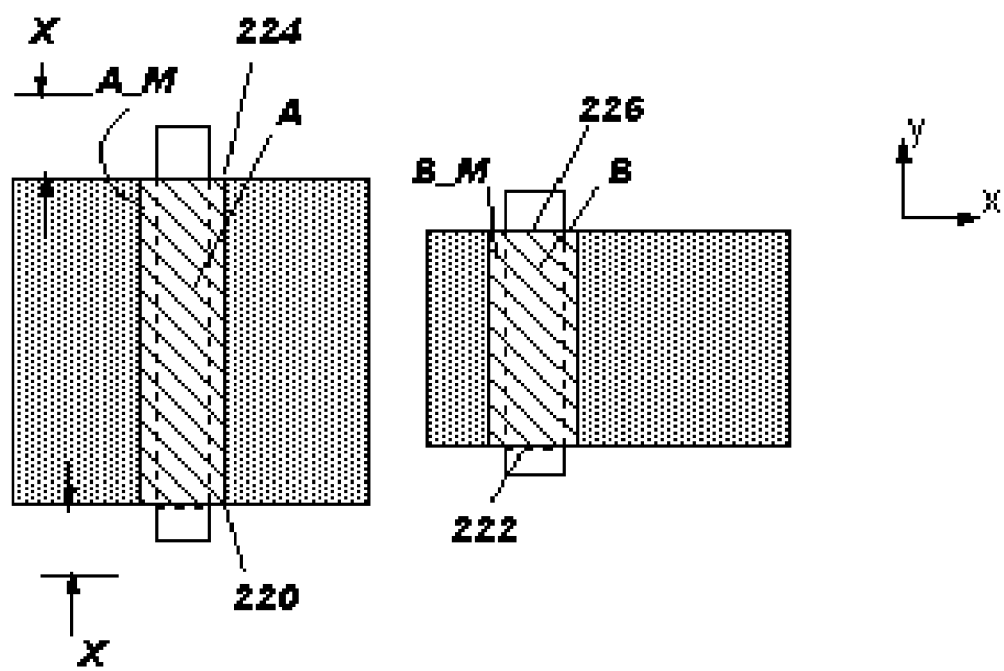
FIGS. 10-16 show details of various shapes relative to creating shape extensions according to the method of FIG. 5.
Figure 11:
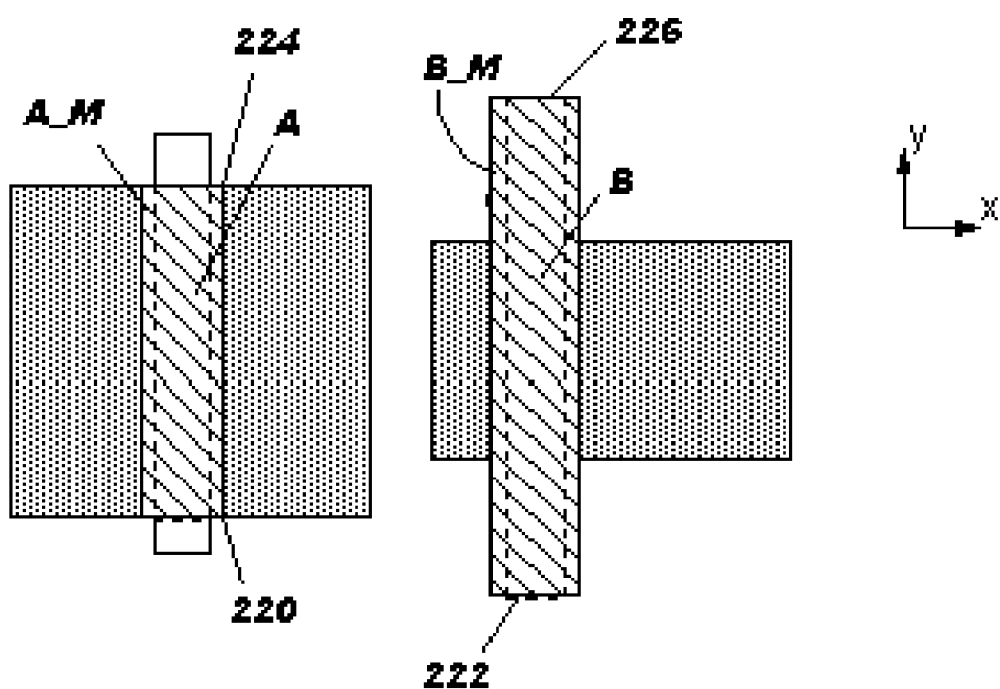

FIGS. 10 and 11 illustrate an example of the above processing. In FIG. 10, a vertical gate A and a neighbor gate B are shown. A marker shape A_M for gate A and a marker shape B_M for gate B are placed. Marker shapes A_M and B_M have ground rules assigned thereto that will force the minimum width pieces of gates A and B to grow if marker shapes A_M and B_M grow. For example, minpert analyzer 128 may be instructed or determine that each end of marker shape B_M must be past the end of gate A by a distance X (the ground rule value), as shown in FIG. 10. In this case, as shown in FIG. 11, a lower end 222 of marker shape B_M must be below a lower end 220 of gate A by a value X and an upper end 226 of marker shape A_M must be above an upper end 224 of gate A by a value X. As a result, as shown in FIG. 11, marker shape B_M will stretch because of this ground rule, and will pull (or plow) the minimum width pieces of gate B along with it.

Figure 12:
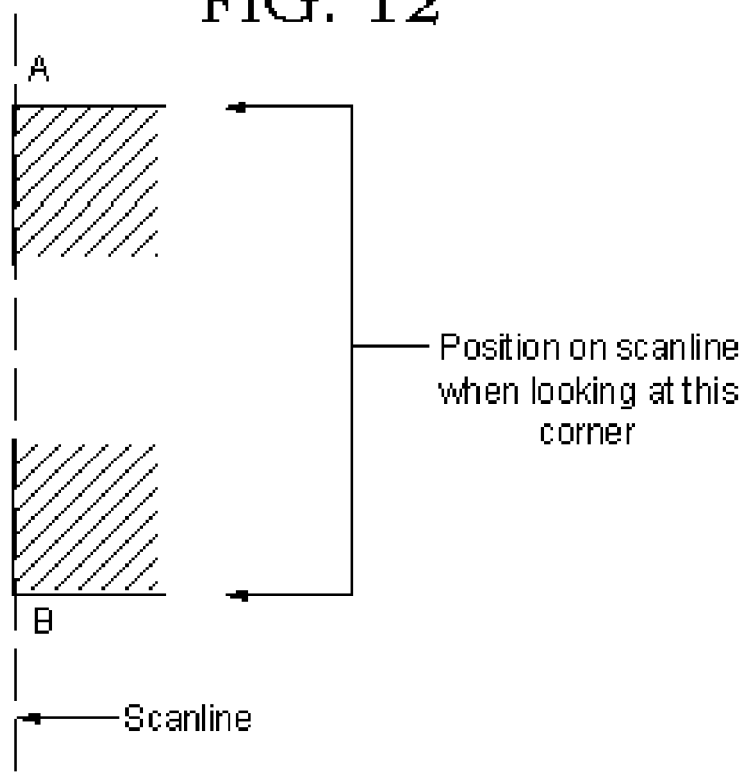
Figure 13:
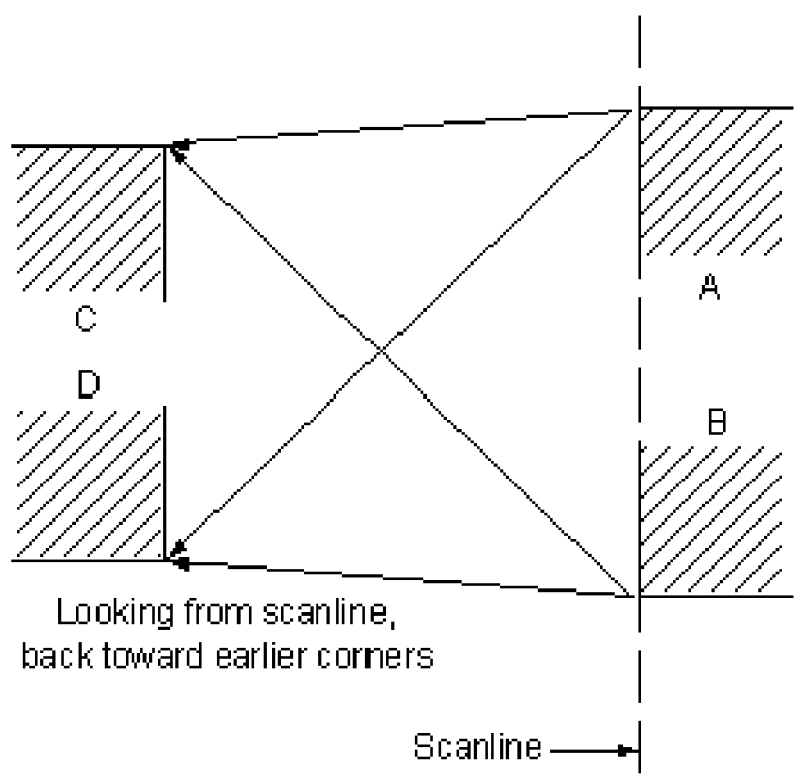
Figure 14:
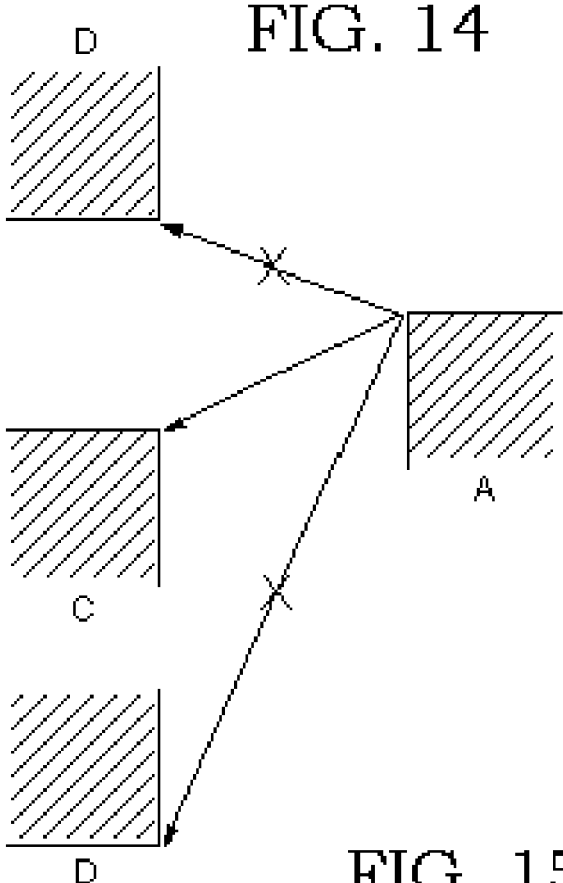
Figure 15:
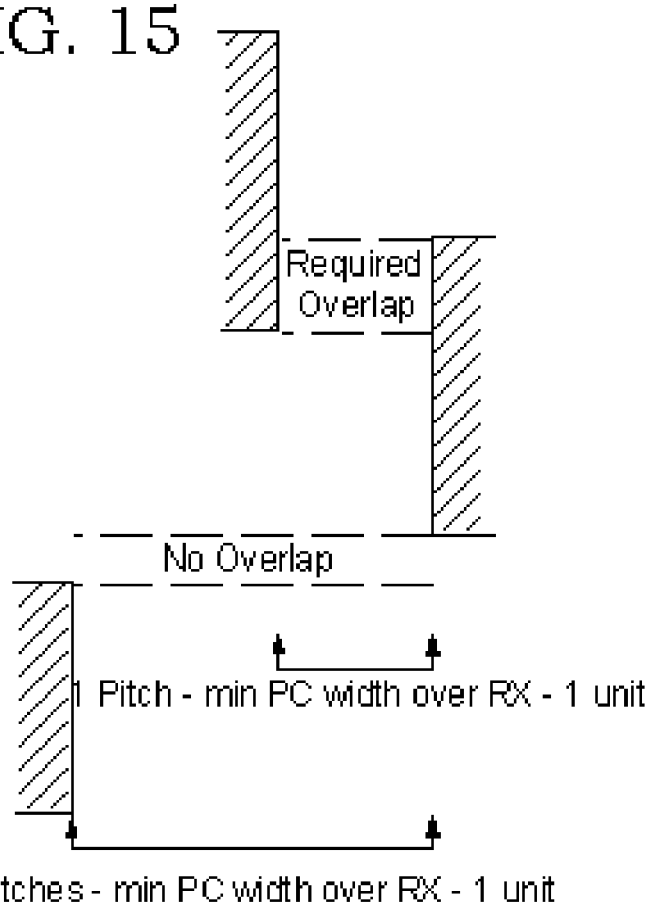
Figure 16:
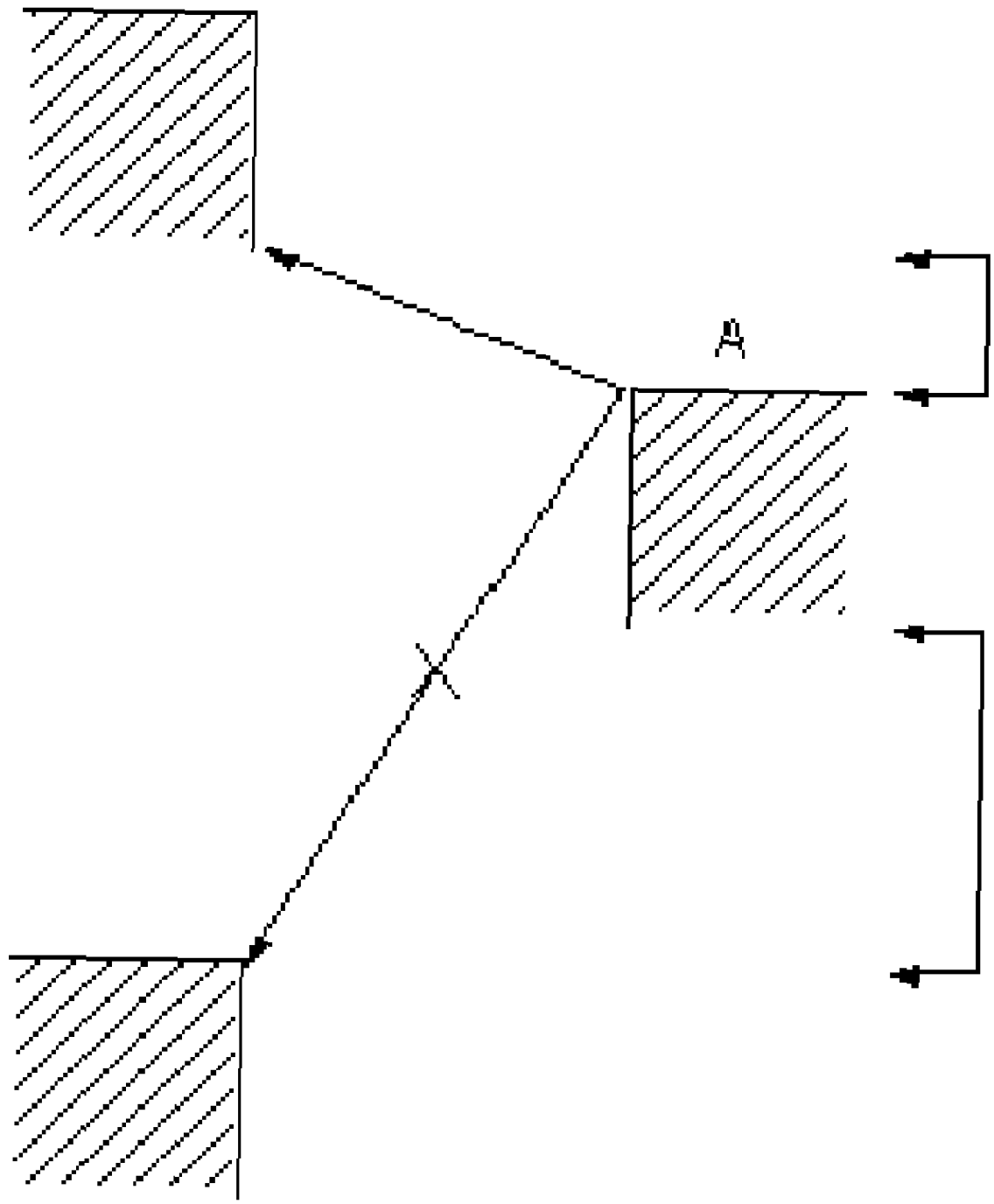

Creating the Gate Extension Constraints: Ground rule constraints can be identified by running the plane sweep algorithm. The algorithm sweeps a virtual line, called the scanline, across the individual edges comprising the layout. When processing gate extensions, corner relationships between a marker shape and a gate are identified, and only convex corners are considered. When sitting at a corner on one shape, a backward (for X-direction, to the left) looking review of a list of previous corners is made. Referring to FIG. 12, two types of corners that are looked backward from are defined: Type A: On the scanline, as one crosses this edge, one moves out of the shape; and Type B: On the scanline, as one crosses this edge, one moves into the shape. As shown in FIG. 13, when one looks backward, two types of convex corners are discernible: Type C: As one moves from below the corner to above the corner, one moves out of the shape; and Type D: As one moves from below the corner to above the corner, one moves into the shape. To illustrate, as shown in FIG. 14, when at a corner of type A, the following are considered: a corner of type C must be in sight, and a corner of type D implies that the wrong end of a gate is being considered. In addition, as shown in FIG. 15, the spacing from the scanline position to the position of the corner must be exactly one or two pitches, minus the minimal PC width over RX, minus one unit (remember, one cover shape was one unit wider than the minimum PC width over RX). Furthermore, the edges involved must overlap in their Y extents. Moreover, as shown in FIG. 16, it must be a closest corner in Y-coordinate meeting the criteria above.

If all of the above-described conditions are met, then a constraint can be generated that tells the corner of type A to stay above the corner of type C by a distance of the extension value. This will pull the A corner up to pass (extend past) the C corner. Corners of type B are similar, except that they match with corners of type D.

A. Details of Legalizing to Meet Grid Constraints on Critical Shapes and Fix Ground Rule Violations in Direction 1—Step S6

Figure 5:
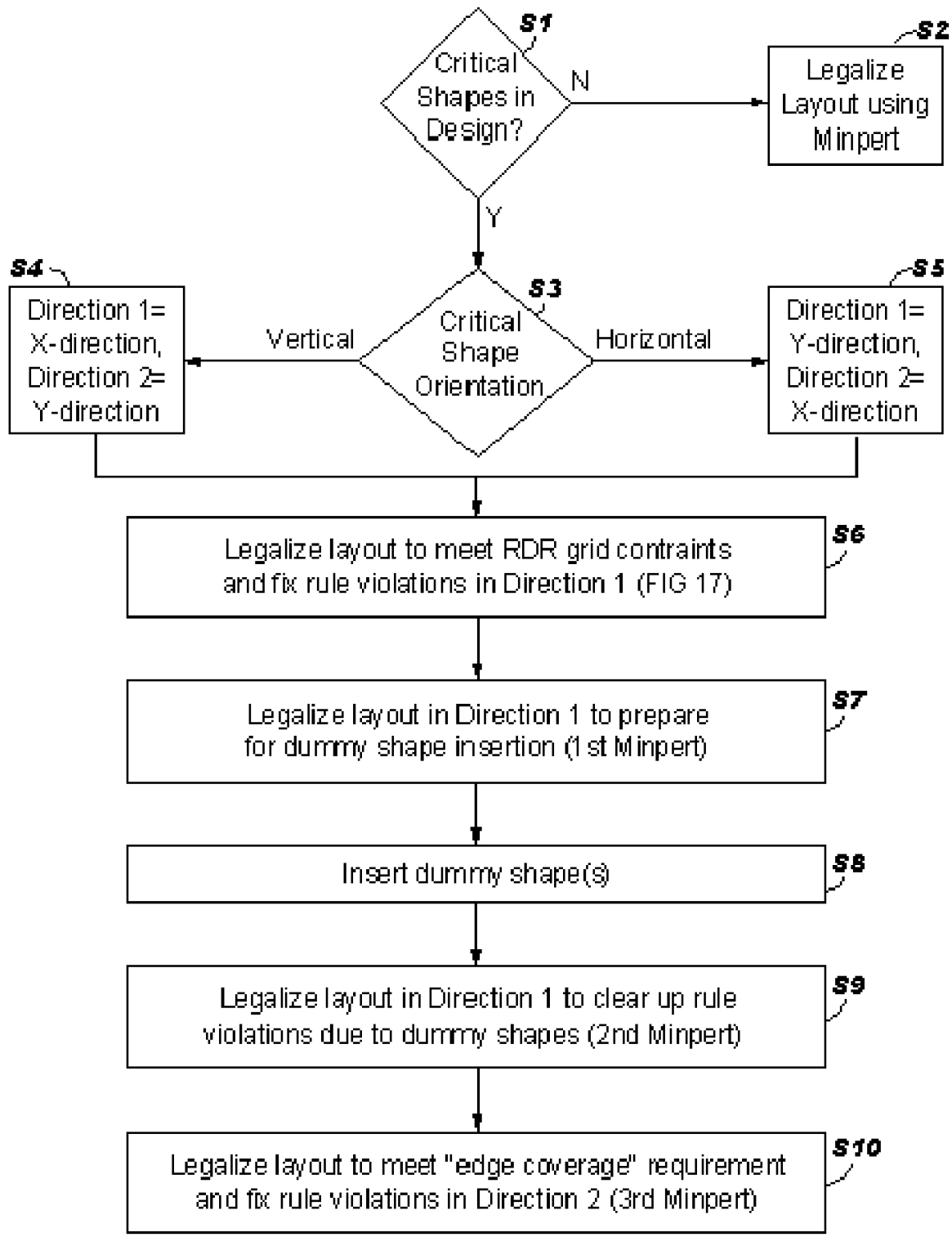
FIG. 5 shows a flow diagram of operational methodology of the system of FIG. 4.
Figure 6:
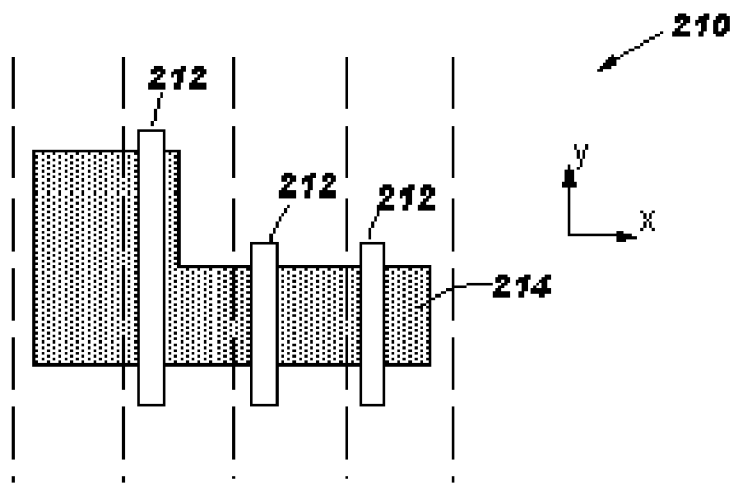
FIG. 6 shows an illustrative integrated circuit design layout at an initial stage.

In step S6 of FIG. 5, the layout is legalized to meet an RDR grid constraint for critical shapes and rule violations are fixed in Direction 1 by graph generator 125, target position determinator 126, and linear programming solver 160. As noted above, the RDR grid constraints on critical shapes in this legalization step may be, for example, when the critical shapes are gates, as follows: a) all the critical shapes shall be placed on the coarse grid of pitch P; b) the space between the left edges of two adjacent critical shapes on a common diffusion shall be either P or 2P; c) the space between the left edges of two adjacent critical shapes not on a common diffusion shall be kP, where k is a positive integer number such that dummy shapes can be inserted to mimic the minimum pitch. The widths of the critical shapes are assumed uniform and not changed during the legalization. The objective of this step is to legalize a layout subject to the ground rules and the above three RDR grid constraints, i.e., find a legal on-pitch location for each critical shape, with minimum layout perturbation of the original design. Hence, this problem is referred to as minimum perturbation legalization with RDR grid constraints (MPRDR). Details of the problem and the invention's solution are described below.

1. The MPRDR Problem a) Background for Solving MPRDR Problem

The problem of minimally modifying a starting layout with ground rule violations so that the resulting layout is ground rule correct was first proposed in "A VLSI artwork legalization technique based on a new criterion of minimum layout perturbation" by Heng et al. in International Symposium on Physical Design 1997 and is disclosed in U.S. Pat. No. 6,189,132. Unlike previous layout compaction techniques, which mainly consider area minimization, minpert-based techniques attempt to improve a given layout by correcting ground rule violations while changing the original layout as little as possible. This part of the invention, as will be described below, simplifies the minpert problem by considering only the one-dimensional (1D) minimum layout perturbation problem. A solution to the two-dimensional (2D) minimum layout perturbation problem is obtained through successive applications of the solution for the one-dimensional (1D) minimum layout perturbation problem.

Similar to the constraint-based compaction techniques, the minpert-based legalization technique transfers edge location constraints into a constraint graph. In a constraint graph, a node $V_i$ represents a layout element $E_i$, usually an edge of a polygon or an instance of an object such as a transistor or a via. As used herein, $V_i(X)$ denotes the X-coordinate of the layout element $E_i$. The minimum distance required by a design rule between two layout elements $E_i$ and $E_j$ is represented by a linear constraint of the form $V_j(X) - V_i(X) \geq d_{ij}$. The constraint corresponds to a directed arc $A_{ij}$, from node $V_i$ to node $V_j$ with weight $d_{ij}$ in the constraint graph. The set of constraints that represents all the interacting elements forms the constraint graph, $G=(V, A)$, of the layout. For purposes of description, $$V_i^{old}(X)$$

denotes the initial x-coordinate of a layout element $E_i$. For an initially ground rule correct layout, all the constraints are satisfied, i.e., $$V_j^{old}(X) - V_i^{old}(X) \geq d_{ij}$$

for all arcs $A_{ij}$ in the constraint graph.

The perturbation on the layout is measured as the distance function from a given layout to the old (initial) layout. The 1D minpert problem is formulated as the following:

$$\min: \sum_{V_i \in V} \|V_i(X) - V_i^{old}(X)\| \quad (1)$$

s.t.:

$$V_j(X) - V_i(X) \geq d_{ij}, \forall A_{ij} \in A$$

L-1 metric:

$$\|V_i(X) - V_i^{old}(X)\| = W_i \cdot |V_i(X) - V_i^{old}(X)|$$

L-2 metric:

$$\|V_i(X) - V_i^{old}(X)\| = W_i \cdot (V_i(X) - V_i^{old}(X))^2$$

The objective function is then linearized by introducing two variables $L_i$, $R_i$ for each edge $E_i$ such that:

$$L_i \geq V_i(X), L_i \leq V_i^{old}(X), R_i \geq V_i(X), R_i \geq V_i^{old}(X)$$

Then, Problem (1) is converted to a linear 1D minpert problem under the L1-metric:

$$\min: \sum_{V_i \in V} W_i \cdot (R_i - L_i) \quad (2)$$

s.t.:

$$V_j(X) - V_i(X) \geq d_{ij}, \forall A_{ij} \in A$$

$$L_i \leq V_i(X), L_i \leq V_i^{old}(X), \forall V_i \in V$$

$$R_i \geq V_i(X), R_i \geq V_i^{old}(X), \forall V_i \in V$$

In order to handle the case where there is no feasible solution, the formulation is further transformed by relaxing the constraints that are not met in the initial layout and penalizing them in the objective function. Let $A_e$ be the set of arcs in A associated with constraints that are not satisfied initially, i.e., $$V_j^{old}(X) - V_i^{old}(X) = D_{ij} < d_{ij}.$$

A new variable $M_i$ is defined for each arc $A_{ij} \in A_e$. The problem is relaxed as follows:

min: (3)

$$\sum_{v_i \in V} W_i \cdot (R_i - L_i) + \lambda \cdot \sum_{A_{ij} \in A_e} (M_i - V_j(X) + d_{ij})$$

s.t.:

$$V_j(X) - V_i(X) \geq d_{ij}, \forall A_{ij} \in A - A_e$$
$$d_{ij} \geq V_j(X) - M_i \geq D_{ij}, M_i - V_i(X) \geq 0, \forall A_{ij} \in A_e$$
$$L_i \leq V_i(X), L_i \leq V_i^{old}(X), \forall V_i \in V$$
$$R_i \geq V_i(X), R_i \geq V_i^{old}(X), \forall V_i \in V$$

By choosing a very large value for $\lambda$, as many unsatisfied constraints in the initial layout as possible can be satisfied as the second item in the objective function is minimized to zero.

Due to the practical constraints imposed by the structure of industrial layout databases and manufacturing considerations, all the layout coordinates must be integers. If all $d_{ij}$ and $$V_i^{old}(X)$$

are integers, which is true in a layout migration problem, then the solutions of Problem (2) and Problem (3) also consist of integers. Therefore, they can be solved as linear programming (LP) problems. In addition, they can be solved efficiently using a Graph-based Simplex algorithm or linear programming solver due to the special structure of the problems.

The linear programming (LP) formula of Problem (3) provides a very flexible optimization framework for VLSI artwork legalization. However, this formulation cannot handle RDR grid constraints because they are not considered in the constraint set. The invention's approach, described below, for the MPRDR problem is based upon and extends the LP formulation to address this situation.

b) Formulating Mixed Integer Linear Programming (MILP) Problem Relative to Solving the MPRDR Problem The primary objective of solving the MPRDR problem is to find a legal on-pitch location for each critical shape. As before, the critical shapes are assumed to be oriented vertically, and the legalization problem is solved in the horizontal direction (the gates are assigned X-coordinates in the layout). For the layout with critical shapes in a horizontal orientation, the methodology works similarly.

As part of the ground rules, the RDR grid constraints on critical shapes form a special set of constraints in the linear programming formulation. Here, $E_{cs}$ denotes the set of layout edges of critical shapes. As the width of the critical shape is uniform and not changed during the legalization, one edge is used (either the centerline or the left edge) of a critical shape to represent the shape position. For purposes of description, the left edge is used.

Given a constraint graph without RDR grid constraints $G = (V, A)$ of a layout, $$V_i^g$$

is a graph node that represents a layout edge $$E_i^g \in E_{cs}, V_i^g \in V,$$

and $$V_i^g(X)$$

denotes the X-coordinate of the edge. $V_{RDR}$ is the set of graph nodes that represent the layout edges of critical shapes constrained by the grid constraints of RDR, $$V_{RDR} \subset V.$$

$$A_{RDR}^s$$

is the set of arcs that represent the RDR space constraints on adjacent critical shapes that share the diffusion region, and $$A_{RDR}^{ns}$$

is the set of arcs that represent the RDR space constraints on adjacent critical shapes, which do not share the diffusion region. Then, the augmented constraint graph $$G' = (V, A \cup A_{RDR}^s \cup A_{RSR}^{ns})$$

represents all of the constraints including RDR.

Given a coarse pitch P for RDR constraints on critical shapes, the MPRDR can be formulated as follows:

min: (4)

$$\sum_{v_i \in V} W_i \cdot (R_i - L_i)$$

s.t.:

$$V_j(X) - V_i(X) \geq d_{ij}, \forall A_{ij} \in A$$
$$L_i \leq V_i(X), L_i \leq V_i^{old}(X), \forall V_i \in V$$
$$R_i \geq V_i(X), R_i \geq V_i^{old}(X), \forall V_i \in V$$
$$V_j^g(X) - V_i^g(X) = \{P, 2P\}, \forall A_{ij} \in A_{RDR}^s$$
$$V_j^g(X) - V_i^g(X) = \{P, 2P \cdots kP\}, \forall A_{ij} \in A_{RDR}^{ns}$$

All the variables must be integers. Furthermore, $$V_i^g(X)$$

must be in a set of integer numbers because of the RDR space constraints, which introduces a set of very stringent constraints into the integer linear programming problem. If the constraint values are normalized with respect to P, i.e., $d_{ij}$ becomes $d_{ij}/P$, and $$V_i^{old}(X)$$

becomes $$V_i^{old}(X)/P,$$

Problem (4) can be approximated by a mixed integer linear programming (MILP) problem as follows:

min: (5)
$$\sum_{V_i \in V} W_i \cdot (R_i - L_i)$$

s.t.:

$$V_j(X) - V_i(X) \geq d_{ij}, \forall A_{ij} \in A$$

$$L_i \leq V_i(X), L_i \leq V_i^{old}(X), \forall V_i \in V$$

$$R_i \geq V_i(X), R_i \geq V_i^{old}(X), \forall V_i \in V$$

$$V_j^g(X) - V_i^g(X) = \{1, 2\}, \forall A_{ij} \in A_{RDR}^s$$

$$V_j^g(X) - V_i^g(X) \geq 1, \forall A_{ij} \in A_{RDR}^{ns}$$

$$V_i^g(X) \text{ is integer}, \forall V_i^g \in V_{RDR}$$

After obtaining a solution to Problem (5), the non-integer variables are converted back to integer values, which may raise some rounding issues. In general, it is expensive to solve an MILP because it is a computationally hard problem. Therefore, this approach is very complex and expensive to implement using conventional MILP solvers when the size of the problem is large.

2. Overview of Heuristic Two-Stage Approach to Solve MPRDR Problem

Figure 17:
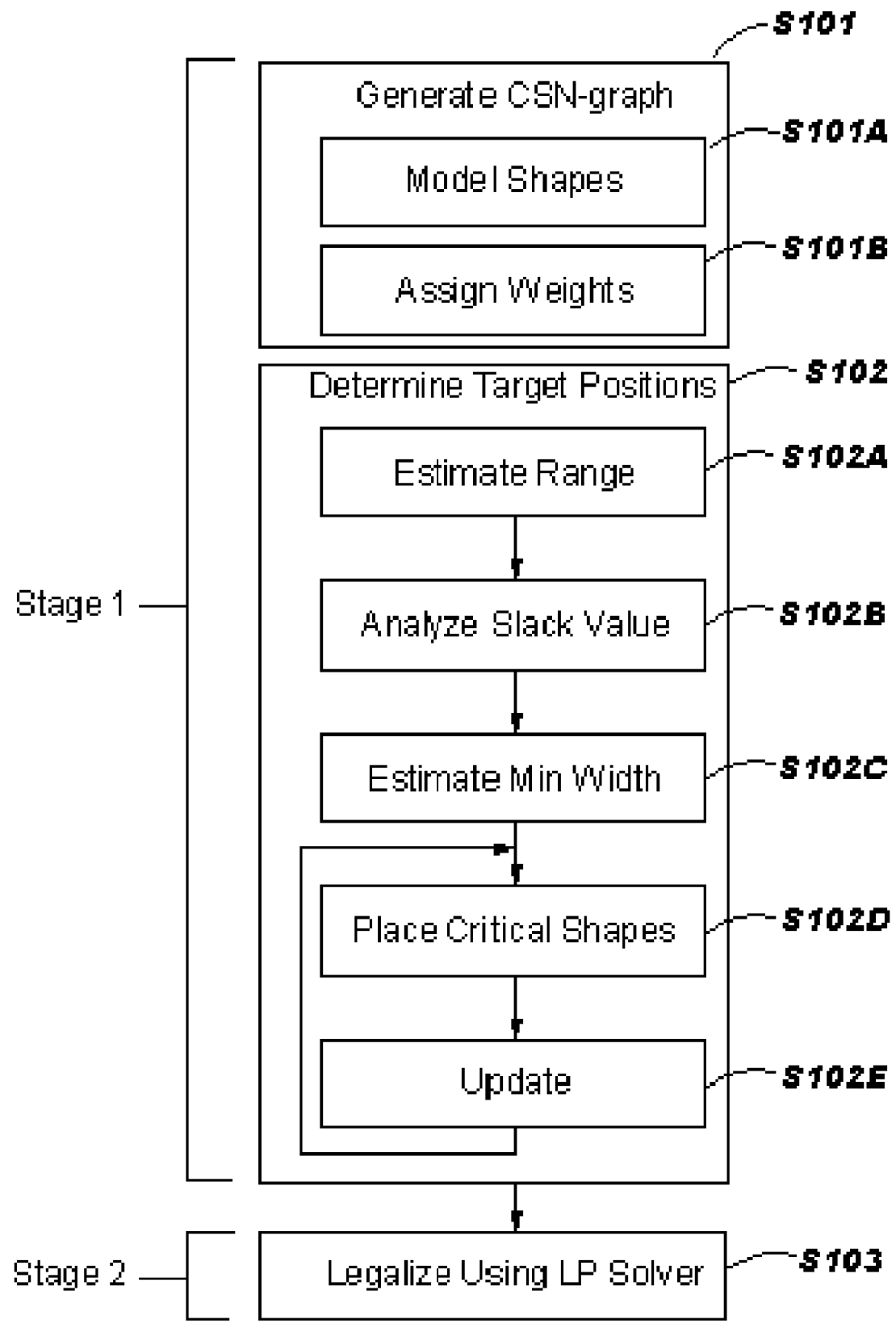
FIG. 17 shows a flow diagram of one embodiment of a detail of the operational methodology of FIG. 5.

Referring to FIGS. 4 and 17, to address the above-described problems, system 100 (FIG. 4) implements a two-stage heuristic solution. As an overview: In the first stage, the target on-pitch position is computed for the critical shapes with minimum perturbation, while satisfying the RDR grid constraints. In the second stage, the layout is legalized by solving the legalization problem as a linear programming problem by treating the target on-pitch position of a critical shape as a ground rule space constraint between it and the design layout boundary. In other words, the RDR related constraints in Problem (4) are relaxed and converted to space constraints between the critical shapes and the design layout boundary based on the target on-pitch positions computed in the first stage so that the problem is transformed back to a linear programming problem, i.e., Problem (3).

a) Stage 1: Compute Target On-Pitch Positions

The first stage is to compute the target on-pitch positions for each of the critical shapes with minimum layout perturbation while satisfying the RDR grid constraints. These steps are carried, as will be described below, by graph generator 125 and target position determinator 126. The inputs are the pitch P, the grid constraints of RDR, and the original locations of the critical shapes in pitch units. The outputs are the target on-pitch positions of critical shapes in pitch units that must be integers.

The problem can be formulated as an Integer Linear Programming (ILP) problem as follows:

min: (6)
$$\sum_{V_i \in V_{RDR}} W_i \cdot (R_i - L_i)$$

s.t.:

$$L_i \leq V_i(X), L_i \leq V_i^{old}(X), \forall V_i \in V_{RDR}$$

$$R_i \geq V_i(X), R_i \geq V_i^{old}(X), \forall V_i \in V_{RDR}$$

-continued $$V_j(X) - V_i(X) = \{1, 2\}, \forall A_{ij} \in A_{RDR}^s$$

$$V_j(X) - V_i(X) \geq 1, \forall A_{ij} \in A_{RDR}^{ns}$$

$$V_i(X) \text{ is integer}, \forall V_i \in V_{RDR}$$

Unlike Problem (2) where the numbers in the constraints are integers, the original locations of critical shapes in pitch units may not be integers. Therefore, Problem (6) cannot be treated as a linear programming problem. Though this problem can be formulated into an ILP problem, the invention does not use an ILP solver because it is expensive to solve an ILP problem, and when there is no feasible solution for the problem, an ILP solver cannot return a result. However, for purposes of the invention, an improved result is better than no result.

To address this situation, the invention implements a heuristic algorithm to solve Problem (6). The algorithm includes two stages.

Stage 1, first step: First, as shown in FIG. 17 in step S101, a directed edge-weighted graph, referred to herein as a "critical shapes neighborhood graph" (hereinafter "CSN-graph") is generated by graph generator 125. Step S101 includes two sub-steps: modeling shapes (S101A) and assigning weights (S101B), which will be described below.

Stage 1, first step, first sub-step: In a first sub-step, step S101A, RDR grid constraints are modeled by graph generator 125 on the critical shapes as a directed edge-weighted graph. To be specific, the critical shapes and their neighborhood relationships are captured into a CSN-graph. The CSN-graph includes nodes that represent critical shapes, and arcs that represent the adjacency between two critical shapes and are weighted with either a minimum or a preferred grid spacing between them in the context of the whole layout and design rules.

Figure 18:
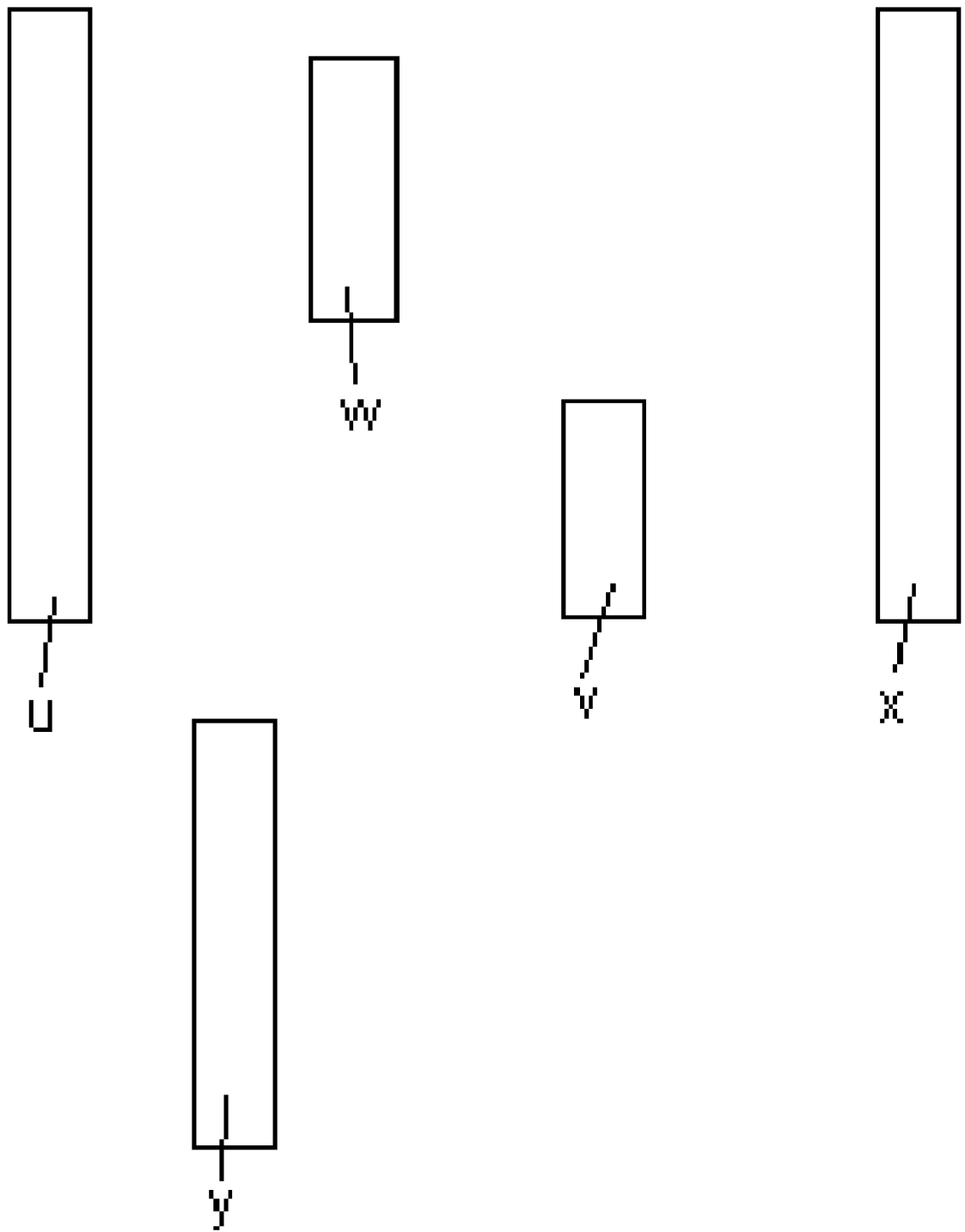
FIG. 18 shows an illustrative IC design layout to illustrate adjacency of shapes for modeling of an edge-weighted graph according to the method of FIG. 5.
Figure 19A:
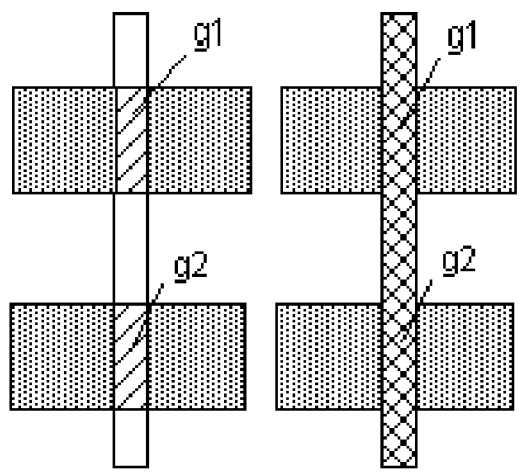
FIGS. 19A-D show various shape arrangements to illustrate critical shapes under the context of RDR.
Figure 19B:
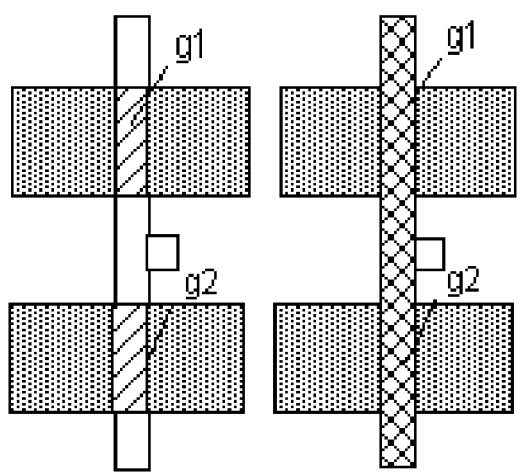
Figure 19C:
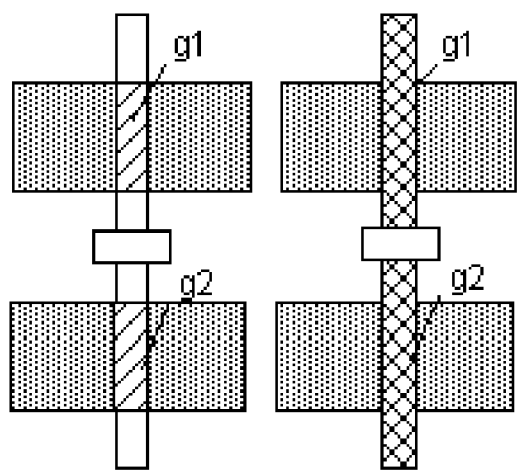
Figure 19D:
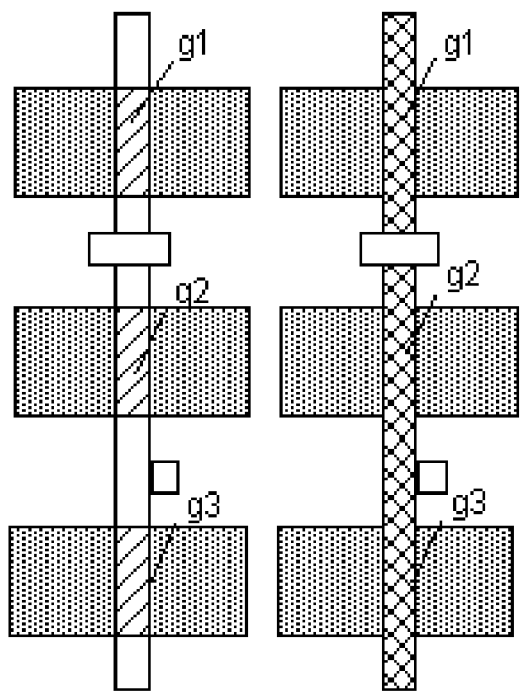

In this case, a "critical shape" is defined as a rectangular shape that is required to comply with the RDR grid constraints, e.g., grid constraints in RDR for critical gates. Critical shapes with vertical orientation a and b are considered "adjacent" in the X-direction if and only if: 1) the projections onto the Y-axis of a and b overlap; 2) x(a)<x(b), where x(a) and x(b) are the X-coordinates of shapes a and b, respectively; and 3) there is no shape c where x(a)<x(c)<x(b), and the projection onto the Y-axis of c overlaps with the projections onto the Y-axis of both a and b. Examples are shown in FIG. 18, wherein the following pairings are adjacent: u-w, u-v, w-x and v-x, and the following pairings are not adjacent: u-y and u-x.

A CSN-graph is a directed graph $$G_{CSN} = (V, A).$$

Vertices represent the critical shapes that are required to meet the RDR grid constraints in the layout and arcs represent the adjacency between them in either X or Y direction. Vertex $V_i$ corresponds to a critical shape labeled as $cs_i$ in a layout. Arc $A_{ij}$ connects vertex $V_i$ to vertex $V_j$ if critical shapes $cs_i$ and $cs_j$ are adjacent, and $cs_i$ is on the left of $cs_j$. There are two types of arcs: a solid arc $A_{ij}$ where the spacing constraints between the corresponding critical shapes $cs_i$ and $cs_j$ are in the form of $$V_j(X) - V_i(X) = \{P, 2P\}$$

where P is the pitch; and a dashed arc $A_{ij}$ where the spacing constraints between the corresponding critical shapes $cs_i$ and $cs_j$ are in the form of $$V_j(X)-V_i(X) \geq kP, k \geq 1$$

and is an integer. For an arc $A_{ij}$ connecting vertices $V_i$ and $V_j$, $V_i$ is called fanin vertex of $V_j$, $V_j$ is called fanout vertex of $V_i$, and $A_{ij}$ is called fanin arc of $V_j$ and fanout arc of $V_i$.

In addition, there is a source vertex s and a sink vertex t in the graph where s corresponds to the left boundary of the layout and t corresponds to the right boundary of the layout. Dashed arcs from source s to vertices with no fanin vertices, and dashed arcs from vertices with no fanout vertices to sink tare added so that the CSN-graph is connected, i.e., any vertex is reachable from source s and can reach sink t. Each arc $A_{ij}$ is weighted using a non-negative integer $w(A_{ij})$ that represents either the minimal or the preferred spacing between two adjacent critical shapes represented by the connected vertices in the CSN-graph in the unit of the coarse pitch P.

The CSN-graph is a directed acyclic graph (DAG), which can be proven by contradiction as follows. Assume there is a loop $V_1 \to V_2 \to \ldots \to V_n \to V_1$ in the CSN-graph $G_{CSN}=(V,A)$, and the X-coordinate of the corresponding critical shape of vertex $V_i$ is denoted as $V_i(X)$ in the initial layout. By the definition of the CSN-graph, $V_1(X) < V_2(X) < \ldots < V_n(X) < V_1(X)$, i.e., $V_1(X) < V_1(X)$, which cannot hold. Therefore, since the assumption does not hold, there is no loop in the CSN-graph and the graph is a directed acyclic graph.

Referring to FIG. 19, under the context of RDR, gates that have the minimum PC width over RX are treated as critical shapes. Sometimes several gates are connected by a PC "trunk" with/without PC jogs, for example, gates $g_1$ and $g_2$ share a PC "trunk" and a PC jog in FIG. 19C. For those gates which share a PC "trunk", they are either treated as a whole or separately when determining their target on-pitch positions. If they are treated separately, i.e., they are not constrained to have the same target on-pitch position, it may bring more flexibility at the cost of inserting additional PC jogs if there is no jog in the original layout. If they are treated as a whole, i.e., they are constrained to have the same target on-pitch position, the topology of the original layout can be preserved at the cost of possible area increase after legalization. In order to differentiate the PC shapes that form gates from PC wiring that connect gates, a "gate-PC shape" is defined as a PC shape that can represent the position of a critical gate or a set of aligned critical gates. The gate-PC shapes are the critical shapes.

FIG. 19 shows how the gate-PC shapes are identified. When there is no PC jog between gates sharing the same PC "trunk", one gate-PC shape is identified to represent the gates (FIG. 19A). When the gates are connected via a "T"-shape PC trunk, one gate-PC shape is used to represent the gates (FIG. 19B). When the gates are connected via a PC jog, each gate is represented by a gate-PC shape (FIG. 19C). For more than two gates sharing a PC trunk, the same modeling is applied. For example, in FIG. 19D, gates $g_2$ and $g_3$ are connected via a "T"-shape PC trunk, so they are represented by one gate-PC shape. Another gate-PC shape represents gate $g_1$ that is connected to $g_2$ via a PC jog. In the case where either none of the gates are connected via a PC trunk, or there is a PC jog on each PC trunk, each gate is represented by a gate-PC shape. If PC jogs are needed for flexibility, a pre-processor can add them into the layout.

In the CSN-graph for gate-PC shapes (critical gates) which are constrained by RDR spacing constraints), solid arc $A_{ij}$ represents the case where vertical gates $g_a$ and $g_b$ share a diffusion region (RX island), $g_a$ is represented by gate-PC shape $cs_i$, and $g_b$ is represented by gate-PC shape $cs_j$, and $cs_i$ and $cs_j$ are adjacent in X-direction. Dashed arc $A_{ij}$ represents the case where vertical gates $g_a$ and $g_b$ do not share a diffusion region (RX island), $g_a$ is represented by gate-PC shape $cs_i$, and $g_b$ is represented by gate-PC shape $cs_j$, and $cs_i$ and $cs_j$ are adjacent in X-direction. So, the grid constraints are represented by the CSN-graph under the context of RDR on critical gates.

An example of the PCN-graph 300 on a layout 302 is shown in FIG. 20.

Similar modeling can be applied to metal wiring shapes if they are critical shapes under the similar grid constraints. In general, given a CSN-graph $G=(V, A)$, $V_i(P)$ denotes the target on-pitch position of vertex $V_i$, $$V_i^{old}(X)$$

denotes the initial location (not necessary on pitch) of the corresponding critical shape $cs_i$. The boundary position of the layout is given, that is, $V_s(X)=0$, $V_t(X)=W$, where W is the target design width in pitch units. The CSN-graph represents the RDR constraint as follows: a) for a solid arc $A_{ij}$ from vertex $V_i$ to vertex $V_j$ with weight of $w(A_{ij})$, $$2 \geq V_j(P)-V_i(P) \geq w(A_{ij});$$

and b) for a dashed arc $A_{ij}$ from vertex $V_i$ to vertex $V_j$ with weight of $w(A_{ij})$, $V_j(P)-V_i(P) \geq w(A_{ij})$. The objective is to minimize the perturbation between the given position and the target position of each gate, i.e., $$|V_i(P)-V_i^{old}(X)|.$$

The critical shapes and their left/right neighborhood relationship can be identified using the plane sweep algorithm which is commonly used for extracting circuit devices from VLSI layouts and generating geometric constraints based on the VLSI design rules.

Stage 1, first step, second sub-step: Second sub-step S101B (FIG. 17) includes graph generator 125 assigning arc weights for the CSN-graph. In particular, each arc $A_{ij}$ is weighted using a non-negative integer $w(A_{ij})$ that represents either the minimal or the preferred spacing between two adjacent critical shapes represented by the connected vertices in the CSN-graph in the pitch unit.

The arc weight must be fairly accurate for estimation because it contributes to the constraints on the target critical shape position. Overly optimistic estimation (small values) may lead to un-achievable solution at the end of the second stage, while overly pessimistic estimation (large values) may lead to unnecessary area overhead.

The basic idea of weight assignment is to first estimate the leftmost and rightmost X-coordinates for a critical shape $cs_i$, denoted as $lx(cs_i)$, $rx(cs_i)$ respectively, in a compacted layout based on the constraint graph without grid constraints. Without loss of generality, it is assumed there is no positive cycle in the constraint graph G. However, if positive cycles exist, various known techniques can be used to remove them. Given an arc $A_{ij}$ connecting vertices $V_i$ and $V_j$ in the CSN-graph $G_{CSN}$, the coarse pitch of P, and their corresponding critical shapes $cs_i$ and $cs_j$ in the layout, if the estimated leftmost position of $cs_i$ is equal to its rightmost position and the estimated leftmost position of $cs_j$ is equal to its rightmost position, i.e., both $cs_i$ and $cs_j$ are "critical" in determining the width of the compacted layout, the weight of arc $A_{ij}$ is assigned as the smallest integer that is larger than $(lx(cs_j)-lx(cs_i))/P$. Otherwise, the longest path $L(cs_i, cs_j)$ is estimated from $cs_i$ to $cs_j$ in the constraint graph G and the arc weight is set as the smallest integer that is larger than $L(cs_i, cs_j)/P$.

Stage 1, second step: As shown in FIG. 17 in step S102, a graph-based, critical shape placement algorithm is implemented, via target position determinator 126, to determine the target on-pitch gate positions based on the CSN-graph.

The following definitions apply for a vertex $V_i$ (and its corresponding critical shape) in $G_{CSN}$. All the positions (locations) are in coarse pitch units:

$V_i^{old}(X)$:

the original x position of $V_i$ in the initial layout with respect to the cell left boundary;

$V_i^{left}(P)$:

the leftmost valid on-pitch position of $V_i$;

$V_i^{right}(P)$:

the rightmost valid on-pitch position of $V_i$;

$V_i^{target}(P)$:

the target on-pitch position of $V_i$; slack($V_i$): the slack of candidate on-pitch positions of $V_i$ and is computed as $V_i^{right}(P) - V_i^{left}(P)$;

$FI(V_i)$: the fanin arc set of vertex $V_i$; and $FO(V_i)$: the fanout arc set of vertex $V_i$. Input to target position determinator 126 includes: CSN-graph of an initial layout $G_{CSN} = (V,A)$, the original location $V_i^{old}(X)$ of each vertex $V_i$, the expected layout width after legalization $W_e$, the width of the initial layout $W_{old}$. The output includes the target on-pitch position $V_i^{target}(P)$ of Vi.

The objective of this implementation is to obtain a valid solution with minimum location perturbation. Even when there is no feasible solution, the algorithm will return an integer solution with some violations on the space constraints.

In the first sub-step S102A, an estimation of a range of possible valid grid positions of each critical shape (vertex in the CSN-graph) is made by position estimator 142. In particular, in order to maintain the goal of minimum layout perturbation, the slack of each critical shape's position, with respect to the valid on-pitch position, is estimated at step S102A by position estimator 142. Because the CSN-graph is a DAG, the topological order for vertices can be determined. This step may include estimating the leftmost valid on-pitch position of $V_i$, i.e., $V_i^{left}(P)$, and the rightmost valid on-pitch position of $V_i$, i.e., $V_i^{right}(P)$ by: topologically sorting vertices in the CSN-graph $G_{CSN} = (V,A)$; conducting a slack analysis by setting $V_s^{left}(P)$ to 0 for source node s, visiting each vertex $V_j$ in the topological order, and setting $V_j^{left}(P)$ to the maximal value among the sums of the leftmost position of its fanin vertex and the weight of the fanin arc, that is, $V_j^{left}(P) \leftarrow \max\{V_i^{left}(P) + w(A_{ij})\}, \forall A_{ij} \in FI(V_j)$;

setting $V_s^{right}(P)$ to the maximal between $V_s^{left}(P)$ and $W_e$ for sink node t; and visiting each vertex $V_i$ in the reversed topological order, and setting $V_j^{right}(P)$ to the minimal value among the difference of the rightmost position of its fanout vertex and the weight of the fanout arc, that is, $V_i^{right}(P) \leftarrow \min\{V_j^{right}(P) - w(A_{ij})\}, \forall A_{ij} \in FO(V_i)$.

Next, at sub-step S102B, an analysis of a slack value of the possible valid grid positions based on the CSN-graph is made by analyzer 144. The more slack a critical shape has, the more freedom there exists in placing it close to its original location and thus causing less perturbation to the original layout. However, once the target location of a critical shape is determined, it will constrain the slack of other critical shapes. Therefore, the order of determining the target on-pitch position for them matters. As will be described below, shape placer 148 places critical shapes in the order of increasing slack so that the most constrained critical shapes are placed earliest and the ones with more flexibility later in the process. Step S102B includes: for each vertex $V_i$, set slack($V_i$) to be the difference between its rightmost position and leftmost position, that is, $\text{slack}(V_i) \leftarrow V_i^{right}(P) - V_i^{left}(P)$;

and then sort the set of slack values (non-negative integer) in non-decreasing order $S_{slack} \leftarrow \{sk_0, sk_1, \ldots, sk_m\}$, and mark all vertices "unanchored" except for source s and sink t, initialize the vertices set $N_a$ as $\{s,t\}$, and $N_{ua}$ as $V - N_a$.

Next in sub-step S102C, an estimation of the minimum width of the layout in terms of grids is made by width estimator 146. Step S102C includes: assigning $W_{min} \leftarrow V_t^{left}(P), W_{target} \leftarrow \max\{W_e, W_{min}\}$, and scaling the initial positions from the old layout dimension to the target dimension proportionally if necessary, i.e., $k \leftarrow W_{target}/W_{old}, V_i^{old}(X) \leftarrow K \times V_i^{old}(X), \forall V_i \in V$.

In sub-step S102D, critical shapes are placed by placer 148 with the least slack in topological order within a corresponding valid position range and as close to the original position as possible. That is, critical shapes with less slack are positioned by placer 148 first, so that more freedom can be left for other shapes with more slack. The vertices are placed batch by batch based on their slack values in non-decreasing order. During each iteration, the un-placed vertices are picked with the smallest slack to place. Vertices with the same slack are placed in their topological order. When determining the target on-pitch location for vertex $V_i$, the position closest to its original location $V_i^{old}(X)$ between $V_i^{left}(P)$ and $V_i^{right}(P)$ is chosen as its target on-pitch location. Placement may include: set $sk_{min}$ be the minimal slack in the slack set $S_{slack}$, initialize vertices set $N_{crit}$ to be the vertices set of "unanchored" vertices with slack of $sk_{min}$, take $sk_{min}$ value from slack set $S_{slack}$, that is, $sk_{min} \leftarrow \min\{sk_i, | sk_i \in S_{slack}\}$, $N_{crit} \leftarrow \{V_i | V_i \in N_{ua}$, slack $(V_i) = sk_{min}\}$, $S_{slack} \leftarrow S_{slack} - \{sk_{min}\}$;

and visiting each vertex $V_j$ in vertices set $N_{crit}$, in the topological order. If a vertex's slack value is zero, set $V_j^{target}(P)$ to be $V_j^{left}(P)$;

else update its leftmost valid on-pitch position $V_j^{left}(P) \leftarrow \max\{V_i^{left}(P) + w(A_{ij})\}, \forall A_{ij} \in FI(V_j)$.

If there is a solid fanin arc $A_{ij}$ and $V_i$ is in vertices set $N_a$, update its rightmost valid on-pitch position $V_j^{right}(P) \leftarrow \max(V_j^{left}(P), \min(V_j^{right}(P), V_i^{target(P)} + 2))$.

If there is a solid fanout arc $A_{ji}$ and $V_i$ is in vertices set $N_a$, then update its leftmost valid on-pitch position $V_j^{left}(P) \leftarrow \min(V_j^{right}(P), \max(V_j^{left}(P), V_i^{target(P)} - 2))$.

Next, assign $V_j^{target}(P)$ to be the closest value to $V_j^{old}(X)$ between $V_j^{left}(P)$ and $V_j^{right}(P)$.

Mark $V_j$ "anchored", and update vertices set $N_a \leftarrow N_a + \{V_j\}$, $N_{ua} \leftarrow N_{ua} - \{V_j\}$.

After each placement, at sub-step S102E, the leftmost and rightmost on-pitch positions of the un-placed vertices and their slack need to be updated for "unanchored" vertices. This step may include: visiting each "unanchored" vertex $V_j$ in the topological order, and updating $V_j^{left}(P) \leftarrow \max\{V_i^{left}(P) + w(A_{ij})\}, \forall A_{ij} \in FI(V_j)$;

then visiting each "unanchored" vertex $V_j$ in the reversed topological order, and updating $V_i^{right}(P) \leftarrow \min\{V_j^{right}(P) - w(A_{ij})\}, \forall A_{ij} \in FO(V_i)$.

Once those functions are completed, a slack value is updated for each affected vertex and the sorted slack set $S_{slack}$ is updated.

Sub-steps S102D and 102E iterate until all the vertices are placed.

Figure 21A:
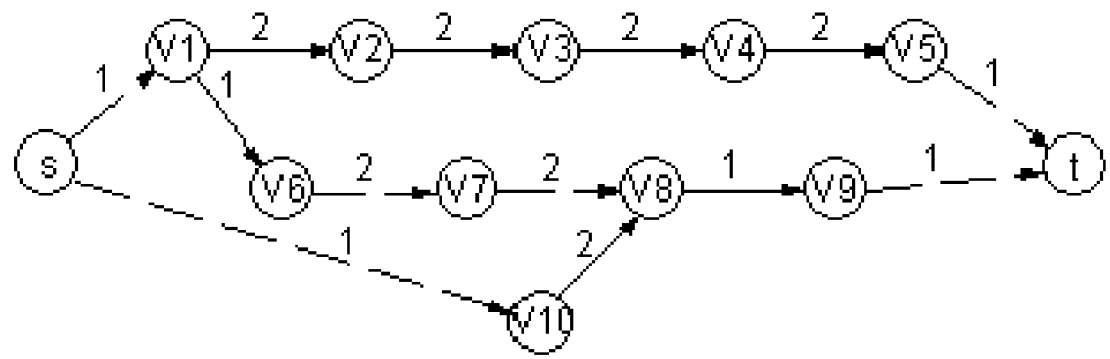
FIGS. 21A-E show various steps of one embodiment for determining target positions according to the methodology of FIG. 17.
Figure 21B:
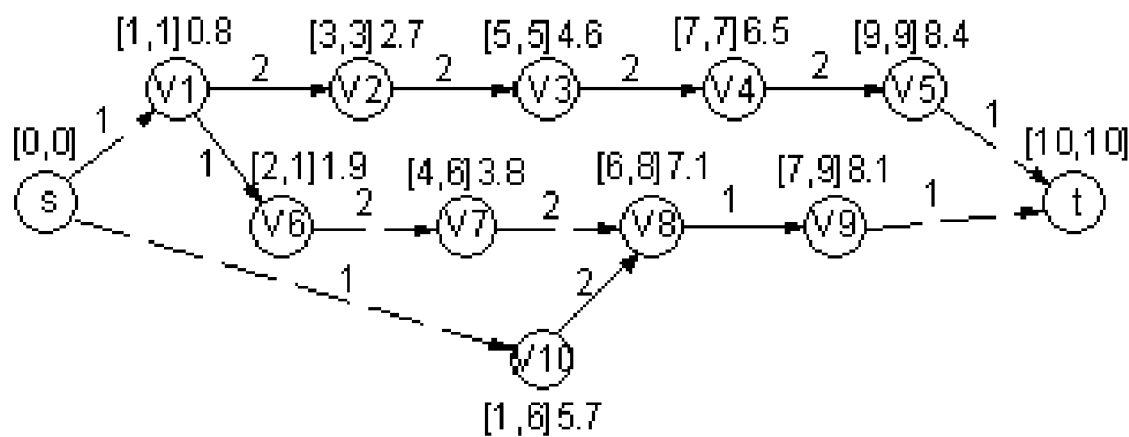
Figure 21C:
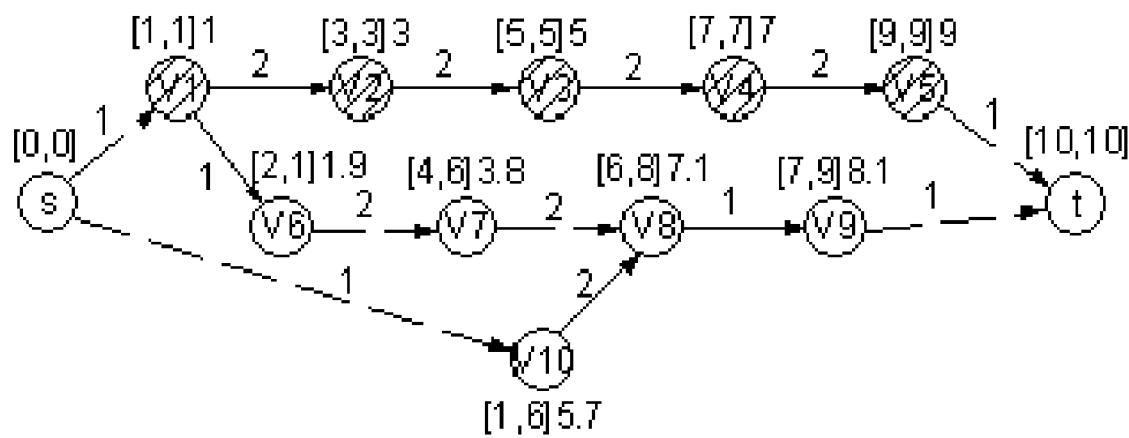
Figure 21D:
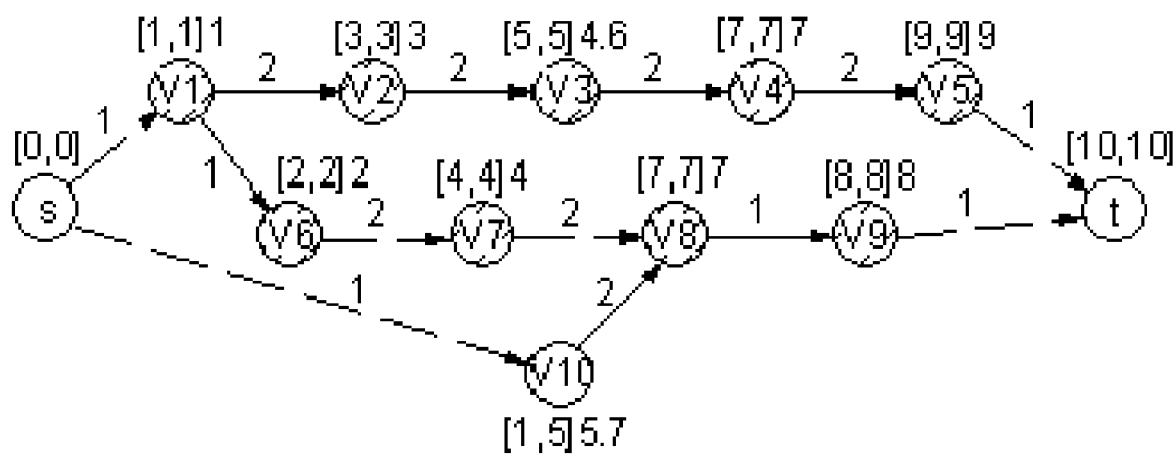
Figure 21E:
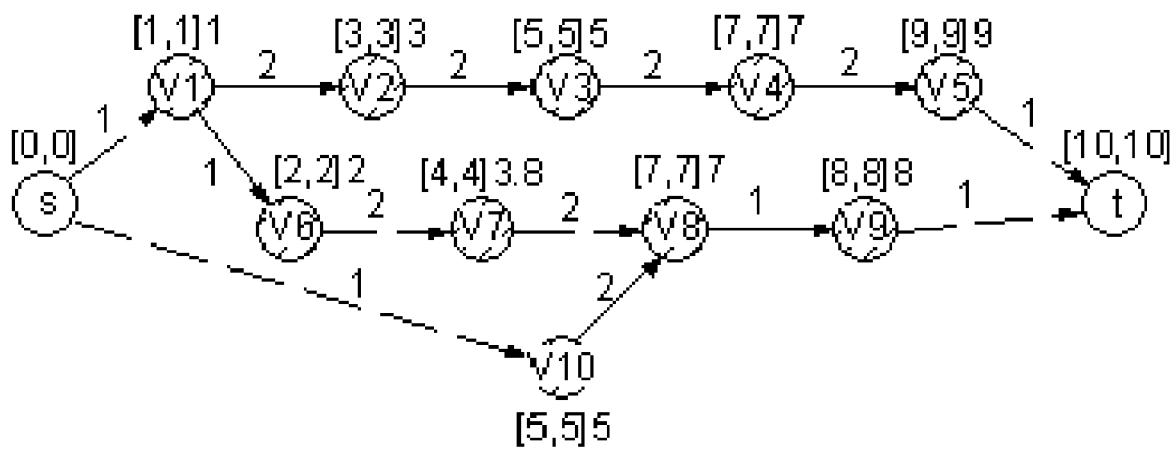

An example placement is shown in FIGS. 21A-E. The CSN-graph of a layout is shown in FIG. 21A. After slack analysis, the slack and old position of the vertices is marked in the form of $[V_i^{left}(P), V_i^{right}(P)], V_i^{old}(X)$, near each vertex in FIG. 21B. In a first iteration, vertices $V_1, V_2, V_3, V_4, V_5$ are placed ("anchored") as they have the smallest slack. The slack of the "unanchored" vertices are updated, as shown in FIG. 21C. In the second iteration, vertices $V_6, V_7, V_8, V_9$ are placed based on their slack and old positions and the slack of $V_{10}$ is updated, as shown in FIG. 21D. Lastly, vertex $V_{10}$ placed, as shown in FIG. 21E.

b) Stage 2: Legalize the Layout

With continuing reference to FIG. 17, the second stage includes step S103, solving the legalization problem as a linear programming problem using linear programming solver 160 (FIG. 4) by treating the target on-pitch position of a critical shape as a set of ground rule space constraints between it and the design layout boundary. As will be described below, system 100 (FIG. 4) employs the LP formula of Problem (3) and uses either the Graph-based Simplex or standard LP solver 160 to solve it.

After the target on-pitch positions are computed in step 102, i.e., for each layout edge of gate $E_i^g$, target on-pitch position is known as $T(E_i^g)$ with respect to the left boundary position of the layout, denoted as lf(X), the grid constraints are then converted in Problem (4) to a set of simple space constraints between the left boundary and gates. So, the constraints of Problem (4) are relaxed as follows:

$$\min: \sum_{v_i \in V} W_i \cdot (R_i - L_i) \quad (6)$$

$$s.t.:$$

$$V_j(X) - V_i(X) \geq d_{ij}, \forall A_{ij} \in A$$

$$L_i \leq V_i(X), L_i \leq V_i^{old}(X), \forall V_i \in V$$

$$R_i \geq V_i(X), R_i \geq V_i^{old}(X), \forall V_i \in V$$

$$V_i^g(X) - V_{lf}(X) \geq T(E_i^g), \forall V_i^g \in V_{RDR}$$

$$V_{lf}(X) - V_i^g(X) \geq -T(E_i^g), \forall V_i^g \in V_{RDR}$$

As Problem (6) is of the same form as Problem (2), the unsatisfied constraints are relaxed similarly as follows. Let $A_e$ be the set of arcs in A associated with constraints that are not satisfied initially, i.e., $V_j^{old}(X) - V_i^{old}(X) = D_{ij} < d_{ij}$, including the newly added space constraints between gates and the left boundary of the design layout. Define a new variable $M_i$ for each arc $A_{ij} \in A_e$.

The problem is relaxed as follows:

$$\min: \sum_{v_i \in V - V_{RDR}} W_i \cdot (R_i - L_i) + \lambda \cdot \sum_{A_{ij} \in A_e} (M_i - V_j(X) + d_{ij}) \quad (3)$$

$$s.t.:$$

$$V_j(X) - V_i(X) \geq d_{ij}, \forall A_{ij} \in A - A_e$$

$$d_{ij} \geq V_j(X) - M_i \geq D_{ij}, M_i - V_i(X) \geq 0, \forall A_{ij} \in A_e$$

$$L_i \leq V_i(X), L_i \leq V_i^{old}(X), \forall V_i \in V$$

$$R_i \geq V_i(X), R_i \geq V_i^{old}(X), \forall V_i \in V$$

By choosing a very large value for $\lambda$, as many unsatisfied constraints in the initial layout as possible can be satisfied when the second item in the objective function is minimized to zero. To allow the gates to move freely, the location perturbation objectives are not applied to the critical shape edges. Either a Graph-based Simplex or standard LP solver 160 can be used to solve this problem. Because the target on-pitch gate locations are computed with consideration of the necessary minimal space between gates, generally they are achievable results in the second stage, in other words, in the results of the second stage, the constraints of $$V_i^g(X)$$

in Problem (6) are satisfied and the value of $$V_i^g(X)$$

is the same as its target on-pitch position.

III. Conclusion

In the previous discussion, it will be understood that the method steps discussed are performed by a processor, such as PU 114 of system 100, executing instructions of program product 122 stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form. In addition, it should be recognized that the above-described invention could be provided as a third party service.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method for migrating an integrated circuit (IC) design layout from a source technology without radical design restrictions (RDR) to a target technology with RDR, the method comprising the steps of:
   legalizing the design layout to meet an RDR grid constraint and fix any ground rule violation in a first direction, wherein the legalizing includes computing a target on-pitch position for each of the plurality of critical shapes with minimum layout perturbation while satisfying the RDR grid constraint, wherein the computing includes generating an edge-weighted graph that models a plurality of critical shapes and a neighborhood relationship thereof and determining target grid positions of the plurality of critical shapes in a first direction using the edge-weighted graph by placing critical shapes with less slack first; and legalizing the design layout as a linear programming problem by treating the target on-pitch positions of the critical shapes as a set of ground rule space constraints between the plurality of critical shapes and a design layout boundary;
   inserting required dummy shapes; and
   running a minimum perturbation analysis in order to address an edge coverage requirement of at least one critical shape and fix any ground rule violation in a second direction.

2. The method of claim 1, wherein the generating step includes:
   modeling the plurality of critical shapes and a neighborhood relationship thereof as an edge-weighted graph; and
   assigning weights to each arc of the edge-weighted graph.

3. The method of claim 1, wherein the determining step includes:
   estimating a range of possible valid grid positions of each critical shape;
   analyzing a slack value of the possible valid grid positions on the edge-weighted graph;
   estimating the minimum width of the layout in terms of grids;
   placing critical shapes with least slack in topological order within a corresponding valid position range and as close to an original position as possible; and
   updating possible valid grid positions and slack for unplaced critical shapes.

4. The method of claim 1, wherein the edge-weighted graph includes nodes that represent critical shapes, and arcs that represent the adjacency between two critical shapes and are weighted with one of a minimum and preferred grid spacing between them.

5. The method of claim 1, wherein the step of inserting required dummy shapes includes:
   running a first minimum perturbation analysis in the first direction with grid positions of a plurality of critical shapes of the design layout fixed and ground rules designed to reduce a diffusion region around the critical shapes;
   inserting at least one dummy shape; and
   running a second minimum perturbation analysis with the grid positions of the plurality of critical shapes and each dummy shape frozen to address any ground rule violation created by each dummy shape in the first direction.

6. The method of claim 5, wherein the at least one dummy shape insertion step includes placing a dummy shape on pitch in any area that is within no more than two grid positions of a critical shape, and is not covered by a diffusion area or another shape.

7. The method of claim 5, wherein the critical shapes and each dummy shape are not moved during the second minimum perturbation analysis in the first direction.

8. The method of claim 1, wherein the minimum perturbation analysis in the second direction further includes correcting any ground rule violations in the second direction, and making all horizontal wiring non-critical in order to minimize phase shift mask layout issues.

9. The method of claim 1, wherein the first direction is a direction orthogonal to a longitudinal axis of the plurality of critical shapes, and the second direction is parallel to the longitudinal axis of the plurality of critical shapes.

10. A system for migrating an integrated circuit (IC) design layout from a source technology without radical design restrictions (RDR) to a target technology with RDR, the system comprising:

means for legalizing the layout to meet an RDR grid constraint and fix any ground rule violation in a first direction, wherein the legalizing means includes means for computing a target on-pitch position for each of the plurality of critical shapes with minimum layout perturbation while satisfying the RDR grid constraint, wherein the computing means includes means for generating an edge-weighted graph that models the plurality of critical shapes and a neighborhood relationship thereof and means for determining target grid positions of the plurality of critical shapes in a first direction using the edge-weighted graph by placing critical shapes with less slack first and means for legalizing the design layout as a linear procgramming problem by treating the target on-pitch positions of the critical shapes as a set of ground rule space constraints between the plurality of critical shape and a design layout boundary;

means for inserting required dummy shapes; and means for running a minimum perturbation analysis in order to address an edge coverage requirement of at least one critical shape and fix any ground rule violation in a second direction.

11. The system of claim 10, wherein the generating means includes:

means for modeling the plurality of critical shapes and a neighborhood relationship thereof as an edge-weighted graph; and means for assigning weights to each arc of the edge-weighted graph.

12. The system of claim 10, wherein the determining means includes:

means for estimating a range of possible valid grid positions of each critical shape;

means for analyzing a slack value of the possible valid grid positions on the edge-weighted graph;

means for estimating the minimum width of the layout in terms of grids;

means for placing critical shapes with least slack in topological order within a corresponding valid position range and as close to an original position as possible; and means for updating possible valid grid positions and slack for unplaced critical shapes.

13. The system of claim 10, wherein the edge-weighted graph includes nodes that represent critical shapes, and arcs that represent the adjacency between two critical shapes and are weighted with one of a minimum and preferred grid spacing between them.

14. The system of claim 10, wherein the required dummy shape insertion means includes:

means for running a first minimum perturbation analysis in the first direction with grid positions of a plurality of critical shapes of the design layout fixed and ground rules designed to reduce a diffusion region around the critical shapes;

means for inserting at least one dummy shape; and means for running a second minimum perturbation analysis with the grid positions of the critical shapes and each dummy shape frozen to address any ground rule violation created by each dummy shape in the first direction.

15. The system of claim 14, wherein the at least one dummy shape insertion means places a dummy shape in any area that is within no more than two grid positions of a critical shape, and is not covered by a diffusion area or another shape.

16. The system of claim 14, wherein each dummy shape is frozen during operation of the second running means.

17. The system of claim 10, wherein the minimum perturbation analysis running means further corrects any ground rule violations in the second direction, and makes all horizontal wiring non-critical in order to minimize phase shift mask layout issues.

18. The system of claim 10, wherein the first direction is a direction orthogonal to a longitudinal axis of the plurality of critical shapes, and the second direction is parallel to the longitudinal axis of the plurality of critical shapes.

19. A computer program product comprising a computer useable medium having computer readable program code embodied therein for migrating an integrated circuit (IC) design from a source technology without radical design restrictions (RDR) to a target technology with RDR, the program product comprising:

program code configured to legalize the layout to meet an RDR grid constraint and fix any ground rule violation in a first direction, wherein the legalizing code includes program code configured to compute a target on-pitch position for each of the plurality of critical shapes with minimum layout perturbation while satisfying the RDR grid constraint, wherein the computing code includes program code configured to generate an edge-weighted graph that models the plurality of critical shapes and a neighborhood relationship thereof and program code configured to determine target grid positions of the plurality of critical shapes in a first direction using the edge-weighted graph by placing critical shapes with less slack first and program code configured to legalize the design layout as a linear programming problem by treating the target on-pitch positions of the critical shapes as a set of ground rule space constraints between the plurality of critical shapes and a design layout boundary;

program code configured to insert required dummy shapes; and program code configured to run a minimum perturbation analysis in order to address an edge coverage requirement of at least one critical shape and fix any ground rule violation in a second direction.

20. The program product of claim 19, wherein the generating code includes:

program code configured to model the plurality of critical shapes and a neighborhood relationship thereof as an edge-weighted graph; and program code configured to assign weights to each arc of the edge-weighted graph.

21. The program product of claim 19, wherein the determining code includes:

program code configured to estimate a range of possible valid grid positions of each critical shape;

program code configured to analyze a slack value of the possible valid grid positions on the edge-weighted graph;

program code configured to estimate the minimum width of the layout in terms of grids;

program code configured to place critical shapes with least slack in topological order within a corresponding valid position range and as close to an original position as possible; and program code configured to update possible valid grid positions and slack for unplaced critical shapes.

22. The program product of claim 19, wherein the edge-weighted graph includes nodes that represent critical shapes, and arcs that represent the adjacency between two critical shapes and are weighted with one of a minimum and a preferred grid spacing between them.

23. The program product of claim 19, wherein the required dummy shape insertion code includes:
program code configured to run a first minimum perturbation analysis in the first direction with grid positions of a plurality of critical shapes of the design layout fixed and ground rules designed to reduce a diffusion region around the critical shapes;
program code configured to insert at least one dummy shape; and
program code configured to run a second minimum perturbation analysis with the grid positions of the critical shapes and the dummy shape frozen to address any ground rule violation created by the dummy shape in the first direction.

24. The program product of claim 23, wherein the at least one dummy shape insertion program code places a dummy shape in any area that is within no more than two grid positions of a critical shape, and is not covered by a diffusion area or another shape.

25. The program product of claim 23, wherein each dummy shape is frozen during operation of the second running means.

26. The program product of claim 19, wherein the minimum perturbation analysis running program code further corrects any ground rule violations in the second direction, and makes all horizontal wiring non-critical in order to minimize phase shift mask layout issues.

27. The program product of claim 19, wherein the first direction is a direction orthogonal to a longitudinal axis of the plurality of critical shapes, and the second direction is parallel to the longitudinal axis of the plurality of critical shapes.

28. A method for legalizing an integrated circuit design layout subject to ground rules and radical design restrictions (RDR) grid constraints with minimum layout perturbation of an original design, the method comprising the steps of:
computing a target on-pitch position for each of a plurality of critical shapes with minimum layout perturbation while satisfying the RDR grid constraint, wherein the computing includes generating an edge-weighted graph that models a plurality of critical shapes and a neighborhood relationship thereof and determining target grid positions of the plurality of critical shapes in a first direction using the edge-weighted graph by placing critical shapes with less slack first; and
legalizing the design layout as a linear programming problem by treating the target on-pitch positions of the critical shapes as a set of ground rule space constraints between the plurality of critical shapes and a design layout boundary.

29. The method of claim 28, wherein the generating step includes:
modeling the plurality of critical shapes and a neighborhood relationship thereof as an edge-weighted graph; and
assigning weights to each arc of the edge-weighted graph.

30. The method of claim 28, wherein the determining step includes:
estimating a range of possible valid grid positions of each critical shape;
analyzing a slack value of the possible valid grid positions on the edge-weighted graph;
estimating the minimum width of the layout in terms of grids;
placing critical shapes with least slack in topological order within a corresponding valid position range and as close to an original position as possible; and
updating possible valid grid positions and slack for unplaced critical shapes.

31. The method of claim 28, wherein the edge-weighted graph includes nodes that represent critical shapes, and arcs that represent the adjacency between two critical shapes and are weighted with one of a minimum and preferred grid spacing between them.

32. A system for legalizing an integrated circuit design layout subject to ground rules and radical design restrictions (RDR) grid constraints with minimum layout perturbation of an original design, the system comprising:
means for computing a target on-pitch position for each of a plurality of critical shapes with minimum layout perturbation while satisfying the RDR grid constraint, wherein the computing means includes means for generating an edge-weighted graph that models a plurality of critical shapes and a neighborhood relationship thereof and means for determining target grid positions of the plurality of critical shapes in a first direction using the edge-weighted graph by placing critical shapes with less slack first; and
means for legalizing the design layout as a linear programming problem by treating the target on-pitch positions of the critical shapes as a set of ground rule space constraints between the plurality of critical shapes and a design layout boundary.

33. The system of claim 32, wherein the generating means includes:
means for modeling the plurality of critical shapes and a neighborhood relationship thereof as an edge-weighted graph; and
means for assigning weights to each arc of the edge-weighted graph.

34. The system of claim 32, wherein the determining means includes:
means for estimating a range of possible valid grid positions of each critical shape;
means for analyzing a slack value of the possible valid grid positions on the edge-weighted graph;
means for estimating the minimum width of the layout in terms of grids;
means for placing critical shapes with least slack in topological order within a corresponding valid position range and as close to an original position as possible; and
means for updating possible valid grid positions and slack for unplaced critical shapes.

35. The system of claim 32, wherein the edge-weighted graph includes nodes that represent critical shapes, and arcs that represent the adjacency between two critical shapes and are weighted with one of a minimum and preferred grid spacing between them.

36. A computer program product comprising a computer useable medium having computer readable program code embodied therein for legalizing an integrated circuit design layout subject to ground rules and radical design restrictions (RDR) grid constraints with minimum layout perturbation of an original design, the program product comprising:

program code configured to compute a target on-pitch position for each of a plurality of critical shapes with minimum layout perturbation while satisfying the RDR grid constraint, wherein the computing code includes program code configured to generate an edge-weighted graph that models a plurality of critical shapes and a neighborhood relationship thereof and program code configured to determine target grid positions of the plurality of critical shapes in a first direction using the edge-weighted graph by placing critical shapes with less slack first; and program code configured to legalize the design layout as a linear programming problem by treating the target on-pitch positions of the critical shapes as a set of ground rule space constraints between the plurality of critical shapes and a design layout boundary.

37. The program product of claim 36, wherein the generating code includes:

program code configured to model the plurality of critical shapes and a neighborhood relationship thereof as an edge-weighted graph; and program code configured to assign weights to each arc of the edge-weighted graph.

38. The program product of claim 36, wherein the determining code includes:

program code configured to estimate a range of possible valid grid positions of each critical shape;

program code configured to analyze a slack value of the possible valid grid positions on the edge-weighted graph;

program code configured to estimate the minimum width of the layout in terms of grids;

program code configured to place critical shapes with least slack in topological order within a corresponding valid position range and as close to an original position as possible; and program code configured to update possible valid grid positions and slack for unplaced critical shapes.

39. The program product of claim 36, wherein the edge-weighted graph includes nodes that represent critical shapes, and arcs that represent the adjacency between two critical shapes and are weighted with one of a minimum and preferred grid spacing between them.

* * * * *